United States Patent
Sim

(10) Patent No.: US 7,333,378 B2
(45) Date of Patent: Feb. 19, 2008

(54) MEMORY DEVICE THAT RECYCLES A SIGNAL CHARGE

(75) Inventor: Jae-Yoon Sim, Los Angeles, CA (US)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 101 days.

(21) Appl. No.: 11/060,308

(22) Filed: Feb. 18, 2005

(65) Prior Publication Data

US 2005/0195669 A1 Sep. 8, 2005

Related U.S. Application Data

(63) Continuation-in-part of application No. 10/635,434, filed on Aug. 7, 2003, now abandoned.

(30) Foreign Application Priority Data

Sep. 18, 2002 (KR) ............... 10-2002-0057031

(51) Int. Cl.
*G11C 7/00* (2006.01)
(52) U.S. Cl. ............ 365/203; 365/230.03; 365/230.06
(58) Field of Classification Search .......... 365/230.03, 365/203, 233.5
See application file for complete search history.

(56) References Cited

U.S. PATENT DOCUMENTS

| | | | |
|---|---|---|---|
| 5,663,911 A | | 9/1997 | Kaneko |
| 5,970,012 A | * | 10/1999 | Takeshima ............. 365/230.01 |
| 6,031,779 A | | 2/2000 | Takahashi et al. |
| 6,034,563 A | * | 3/2000 | Mashiko ...................... 327/544 |
| 6,069,828 A | | 5/2000 | Kaneko et al. |
| 6,233,188 B1 | | 5/2001 | Kai |
| 6,373,763 B1 | | 4/2002 | Taito et al. |
| 6,378,102 B1 | * | 4/2002 | Watanabe et al. ........... 714/763 |
| 6,649,984 B1 | * | 11/2003 | Noda et al. ................. 257/392 |
| 2001/0001230 A1 | * | 5/2001 | Proebsting ................... 327/536 |

OTHER PUBLICATIONS

German Office Action dated Sep. 13, 2006.

* cited by examiner

*Primary Examiner*—Thong Q. Le
(74) *Attorney, Agent, or Firm*—Harness, Dickey & Pierce, P.L.C.

(57) ABSTRACT

A semiconductor memory device having a shared sense amplifier architecture includes a bitline equalizing voltage generator, which recycles a boost voltage to generate bitline equalizing voltage. The bitline equalizing voltage is used to generate signals for activating bitline equalizing circuits to precharge the bitlines of at least one of the first and second memory block with a bitline precharge voltage, when the memory block is not currently selected for a data operation. The bitline equalizing voltage generator may be configured to recycle the boost voltage that was used to generate a bitline isolation signal or a wordline drive signal.

19 Claims, 15 Drawing Sheets

US 7,333,378 B2

MEMORY DEVICE THAT RECYCLES A SIGNAL CHARGE

This application claims the priority of Korean Patent Application No. 2002-0057031 filed on Sep. 18, 2002, and is a continuation-in-part application of U.S. patent application Ser. No. 10/635,434, filed on Aug. 7, 2003 now abandoned, entitled "MEMORY DEVICE HAVING BITLINE EQUALIZING VOLTAGE GENERATOR WITH CHARGE REUSE", the contents of both of which are herein incorporated by reference in their entirety.

FIELD OF THE INVENTION

This invention relates to semiconductor memory devices, and more particularly, to a bitline equalizing voltage generator that recycles a pre-charged voltage.

BACKGROUND OF THE INVENTION

A dynamic random access memory (DRAM) is a type of semiconductor memory devices that senses and amplifies data stored in memory cells by means of a sense amplifier.

The sense amplifier, which is coupled to a pair of bitlines, senses data stored in a selected memory cell by detecting a difference in potential between the bitlines. One of the bitlines is connected to a capacitor in the selected memory cell. By detecting a difference between a voltage applied to this bitline by a charged stored in the capacitor, and a bitline precharge voltage applied to the other bitline, the sense amplifier detects data stored in the selected memory cell.

A sense amplifier may be exclusively assigned to one memory block. Alternatively, a sense amplifier may be shared by adjacent memory blocks, and configured to detect data in a memory cell of a selected memory block.

FIG. 1 shows an example of a memory device 100 constructed to include a shared sense amplifier. Referring to FIG. 1, there are several core circuits, such as bitline equalizing circuits 112 and 122, bitline isolation circuits 116 and 126, and a column selection circuit 140, which are arranged between a shared sense amplifier 130 and two adjacent memory blocks 110 and 120.

Each of the bitline equalizing circuits 112 and 122 provides a precharge voltage VBL to bitline pairs BL/BLB in first and second memory blocks 110 and 120 before the sense amplifier 130 senses a potential difference between the bitlines BL and BLB in one of these pairs. The first bitline isolation circuit 116 turns on and, thereby, electrically connects the bitline pair BL/BLB of the first memory block 110 with the sense amplifier 130, when the data of the memory cell in the first memory block 110 is to be sensed. At this time, the second bitline isolation circuit 126 turns off and thereby electrically disconnects the sense amplifier 130 with the bitline pair BL/BLB of the second memory block 120.

Alternatively, when the second bitline isolation circuit 126 operates to electrically connect the bitline pair BL/BLB of the second memory block 120 to the sense amplifier 130, the bitline pair BL/BLB of the first memory block 110 and the sense amplifier 130 are electrically disconnected via the first bitline isolation circuit 116.

The column selection circuit 140 transfers the data, which is amplified by the sense amplifier 130 from the selected one of the first and second memory blocks 110 and 120, to data input/output lines IO and IOB.

In the shared sense amplifier structure, a procedure whereby data of the memory cell MC0 of the first memory block 110 is sensed, followed by data in the memory cell MC1 of the second memory block 120 being sensed, is described below.

When first and second bitline equalizing signals PEQi and PEQj are set to high levels corresponding to an external voltage VEXT, the bitlines BL and BLB are pre-charged with the bitline precharge voltage VBL.

Thereafter, in order to sense the memory cell MC0 of the first memory block 110, the first bitline equalizing signal PEQi is set to a low level corresponding to a ground voltage (or a substrate voltage) VSS and the first bitline isolation signal PISOi is set to a high level corresponding to a boosting voltage VPP. A wordline WLn−1 of the memory cell MC0 is also set to the boosting voltage VPP. As a result, the data of the memory cell MC0 is transferred to the sense amplifier 130 as a result of the charge in the memory cell's MC0 capacitor being applied to the bitline BL.

On the other hand, to sense the data in memory cell MC1 of the second memory block 120, the second bitline equalizing signal PEQj is set to a low level corresponding to the voltage of VSS, while a wordline WL1 is driven with the boosting voltage VPP and the second bitline isolation signal PISOj is set to a high level of VPP. Then, the data of the memory cell MC1 is transferred to the sense amplifier 130 as a result of the memory cell's MC1 capacitor applying its charge to the bitline BL. In the meantime, the first bitline equalizing signal PEQi is set to a high level of VEXT, so that the bitlines BL and BLB of the first memory block 110 are pre-charged to the bitline precharge voltage VBL.

The above-described operation are further illustrated with reference to FIG. 2. Specifically, FIG. 2 illustrates the voltage levels of the bitline isolation signals PISOi and PISOj, the first bitline equalizing signal PEQi, and wordline signal WL as a first memory cell MC0 in the first memory bock 110 is selected. As shown in FIG. 2, the bitline isolation signals PISOi and PISOj each has a voltage level corresponding to an internal voltage VINT of the semiconductor memory device 100 as the bitlines BL and BLB of the first memory block 110 are being pre-charged. When the first memory block 110 is selected, the first bitline isolation signal PISOi is set to a high voltage level of VPP, while the second bitline isolation signal PISOj goes to a low voltage level of VSS.

At this time, the first bitline equalizing signal PEQi transitions from the high level of VEXT to the low-level of VSS. Thereafter, the wordline signal is set from the low-level of VSS to its high voltage level of VPP as data in memory cell MC0 is being sensed.

After the data is sensed, the wordline signal WL returns to VSS, and the first bitline equalizing signal PEQi is set to high (VEXT) to pre-charge the bitline pair BL/BLB. Thus, the bitline isolation signals PISOi and PISOj return to the level of internal voltage VINT.

By changing the first bitline equalizing signal PEQi from the low VSS to the high VEXT, the bitlines BL and BLB are pre-charged with the bitline precharge voltage VBL. The speed at which the bitlines BL and BLB are pre-charged with the bitline precharge voltage VBL is dependent on the gate-source voltages VGS of first and second equalizing transistors 113 and 114.

When the DRAM device 100 is harmonized with a low-voltage environment, the gate-source voltages VGS of the first and second equalizing transistors 113 and 114 is settled at about 0.5V when the internal voltage VINT is lowered to 1.0V. This is in accordance with the external voltage VEXT decreasing to 1.0V and the bitline precharge voltage VBL is established at half of the internal voltage VINT, i.e., 0.5V.

To pre-charge the bitline pairs BL/BLB of the first and second memory blocks 110 and 120, the bitline equalizing signals PEQi and PEQj should have voltages higher than the threshold voltages of the first and second equalizing transistors 113 and 114, respectively. However, in the low-voltage operating condition, if these threshold voltages are higher than 0.5V, the bitlines BL and BLB may not be pre-charged because the first and second equalizing transistors 113 and 114 are not turned on. In such a situation, the bitline equalizing signals PEQi and PEQj applied to the gates of the first and second transistors 113 and 114 should be set at a voltage level higher than the external voltage VEXT in order to pre-charge the bitline pairs BL/BLB.

Also, when the DRAM is situated in a standby mode under low-voltage operating conditions, the bitlines BL and BLB coupled to the sense amplifier 130 are pre-charged with the bitline precharge voltage VBL through the first and second bitline isolation circuits 116 and 126, respectively. Thus, the voltage levels of the first and second equalizing signals PEQi and PEQj should have voltage levels that exceed the bitline precharge voltage VBL at least by an amount equal to the threshold voltages of the equalizing transistors 113 and 114. Namely, to ensure that the equalizing signals PEQi and PEQj operate normally, their voltage levels should be at least equal to VBL+Vth (i.e., VINT/2+Vth=VEXT/2+Vth).

Therefore, it would be advantageous under the low-voltage operating condition for the bitline equalizing signals PEQi and PEQj to be bootstrapped up to voltage levels that are higher than the external voltage VEXT, by means of a pumping operation. However, such a voltage pumping inevitably causes current consumption even though the DRAM is designed to be operable in the low-voltage operational environment.

SUMMARY OF THE INVENTION

Exemplary embodiments of the present invention are directed to a semiconductor memory device including a shared sense amplifier between two adjacent memory blocks, which is capable of equalizing bitline pairs with smaller current consumption while operating in a low-voltage environment. Exemplary embodiments are also directed to a semiconductor memory device capable of equalizing bitline pairs in a low-voltage environment without requiring an internal pumping operation.

According to an exemplary embodiment of the present invention, a semiconductor memory device, which selectively connects at least one memory block to a sense amplifier via a pair of bitlines in response to a bitline isolation signal, includes a bitline equalizing voltage generator that generates bitline equalizing voltage. The bitline equalizing voltage generator may recycle a voltage of the bitline isolation signal to generate a bitline equalizing voltage that is sufficient to turn on a transistor within the bitline equalizing circuit, and thereby activate the bitline equalizing circuit to apply a precharge voltage to the pair of bitlines.

According to another exemplary embodiment, the semiconductor memory device may include a bitline equalizing signal generator that is operable to output either an external voltage applied to the memory device or the generated bitline equalizing voltage as a bitline equalizing signal for activating the bitline equalizing circuits. Thus, in situations where the external voltage is not sufficient to activate the bitline equalizing circuits, e.g., during low-voltage operating conditions, the bitline equalizing circuits may still be operable to apply the precharge voltage to the pair of bitlines.

According to another exemplary embodiment of the present invention, a semiconductor memory device may include a bitline equalizing voltage generator that recycles a voltage of a word line drive signal, rather than the bitline isolation signal, to generate a bitline equalizing voltage that is sufficient to activate the bitline equalizing circuit. In an exemplary embodiment, According to another exemplary embodiment of the present invention, the bitline equalizing voltage generator may be configured to output an intermediary bitline equalizing voltage to a switch circuit connected to the bitline equalizing signal generator. In an exemplary embodiment, the semiconductor memory device may further include an external voltage detector for detecting whether the external voltage is below a normal operating level. If the external voltage is below the normal level, the switch circuit may be enabled to output the intermediary bitline equalizing voltage as the bitline equalizing voltage sent to the bitline equalizing signal generator. Otherwise, the switch circuit may output the external voltage as the bitline equalizing voltage sent to the bitline equalizing signal generator.

In another exemplary embodiment, the semiconductor memory device may include a bitline equalizing voltage detector for determining whether the intermediary bitline equalizing voltage is below a certain operating level. For example, the bitline equalizing voltage detector may be determined whether the intermediary equalizing voltage is at a sufficient level to activate the bitline equalizing circuit. If not, a charge pump circuit increases, or pumps up, the external voltage. Thus, the external voltage level may be increased, so that the signal output by the bitline equalizing signal generator is sufficient to activate the bitline equalizing circuit.

BRIEF DESCRIPTION OF THE DRAWINGS

Exemplary embodiments of the present invention will become readily apparent in view of the detailed description of exemplary embodiments set forth below with reference to the accompanying drawings, in which like reference numerals designate like structural elements, and, in which.

DETAILED DESCRIPTION OF THE
EXEMPLARY EMBODIMENTS OF THE
PRESENT INVENTION

Exemplary embodiments of the present invention are described more fully hereinafter with reference to the accompanying drawings. Exemplary embodiments of the present invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 1:
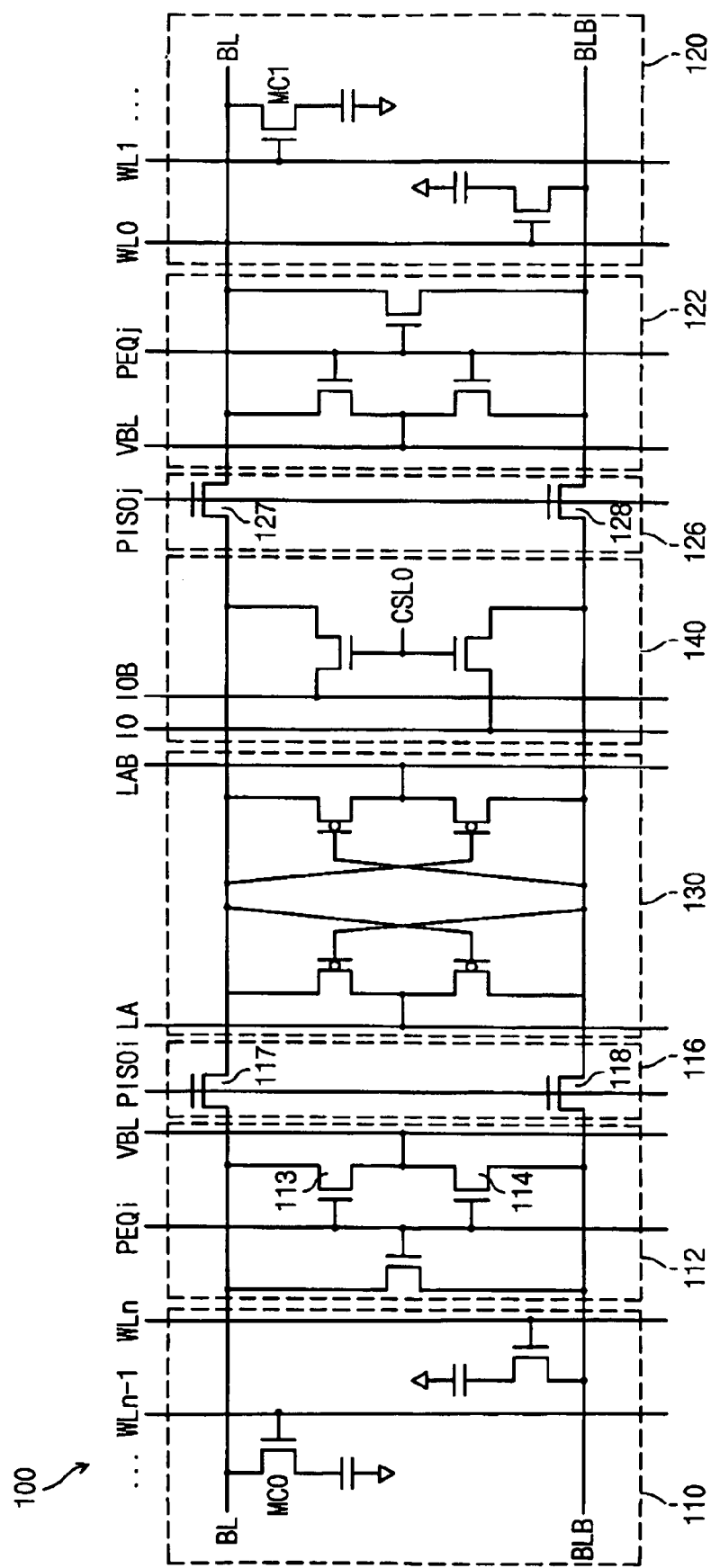
FIG. 1 is a circuit diagram illustrating an example of a conventional structure of a memory device utilizing a shared sense amplifier.

Exemplary embodiments of the present invention is applicable to a semiconductor memory device having at least one shared sense amplifiers, each of which may be connected to a plurality of blocks of memory cells. For example, as shown in FIG. 1, a shared sense amplifier 130, in accordance with exemplary embodiments of the present invention, may be selectively and/or operatively connected to an one of a first memory block 110 and a second memory block 120 via a pair of bitlines BL and BLB.

In exemplary embodiments of the present invention, bitline equalizing signals PEQi and PEQj may be driven with an external voltage VEXT applied to the memory device 100. The bitline isolation signals PISOi and PISOj may be driven with a boost voltage VPP, which may be higher than the external voltage VEXT.

Figures 3A, 3B:
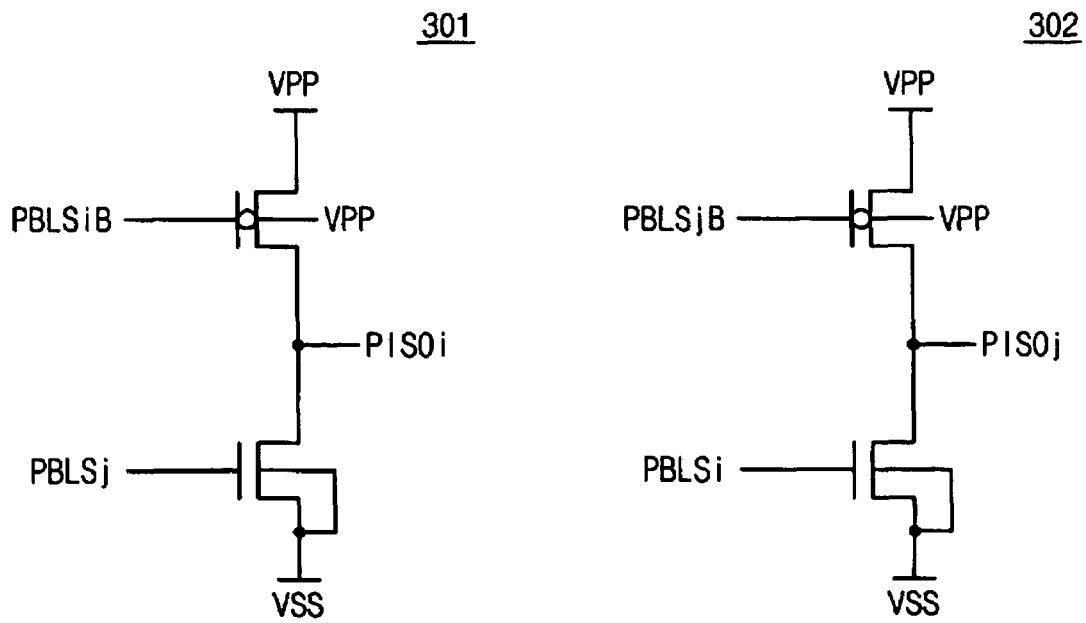
FIGS. 3A and 3B are schematic diagrams illustrating bitline isolation signal generators according to an exemplary embodiment of the present invention.

FIGS. 3A and 3B are schematic diagrams illustrating exemplary embodiments of bitline isolation signal generators, which may generate first and second bitline isolation signals PISOi and PISOj, respectively. Referring to FIG. 3A, a first bitline isolation signal generator 301 may use the boost voltage VPP as a power source and may generate the first bitline isolation signal PISOi in response to receiving a first block selection signal PBLSiB (the complementary signal of PBLSi) and/or a second memory block selection signal PBLSj as, for example, high-level voltage signals. Referring to FIG. 3B, a second bitline isolation signal generator 302 may use the boost voltage VPP as a power source and may generate the second bitline isolation signal PISOj in response to receiving higher level signals as the second complement block select signal PBLSjB (the complementary of PBLSj) and/or the first memory block selection signal PBLSi.

The first and second bitline isolation signals, PISOi and PISOj, may be active, (e.g., set to higher levels), at alternating times with respect to one another. The first memory block 110 may be selected, the first memory block selection signal PBLSi may be at a higher level, and the first bitline isolation signal PISOi may be at a higher level of VPP, while the second bitline isolation signal PISOj may be at a lower level of VSS.

The second memory block 120 may be selected, the second memory block selection signal PBLSj may be at a higher level, and the second bitline isolation signal PISOj may be at a higher level of VPP, while the first bitline isolation signal PISOi may be at a lower level of VSS.

Figure 4:
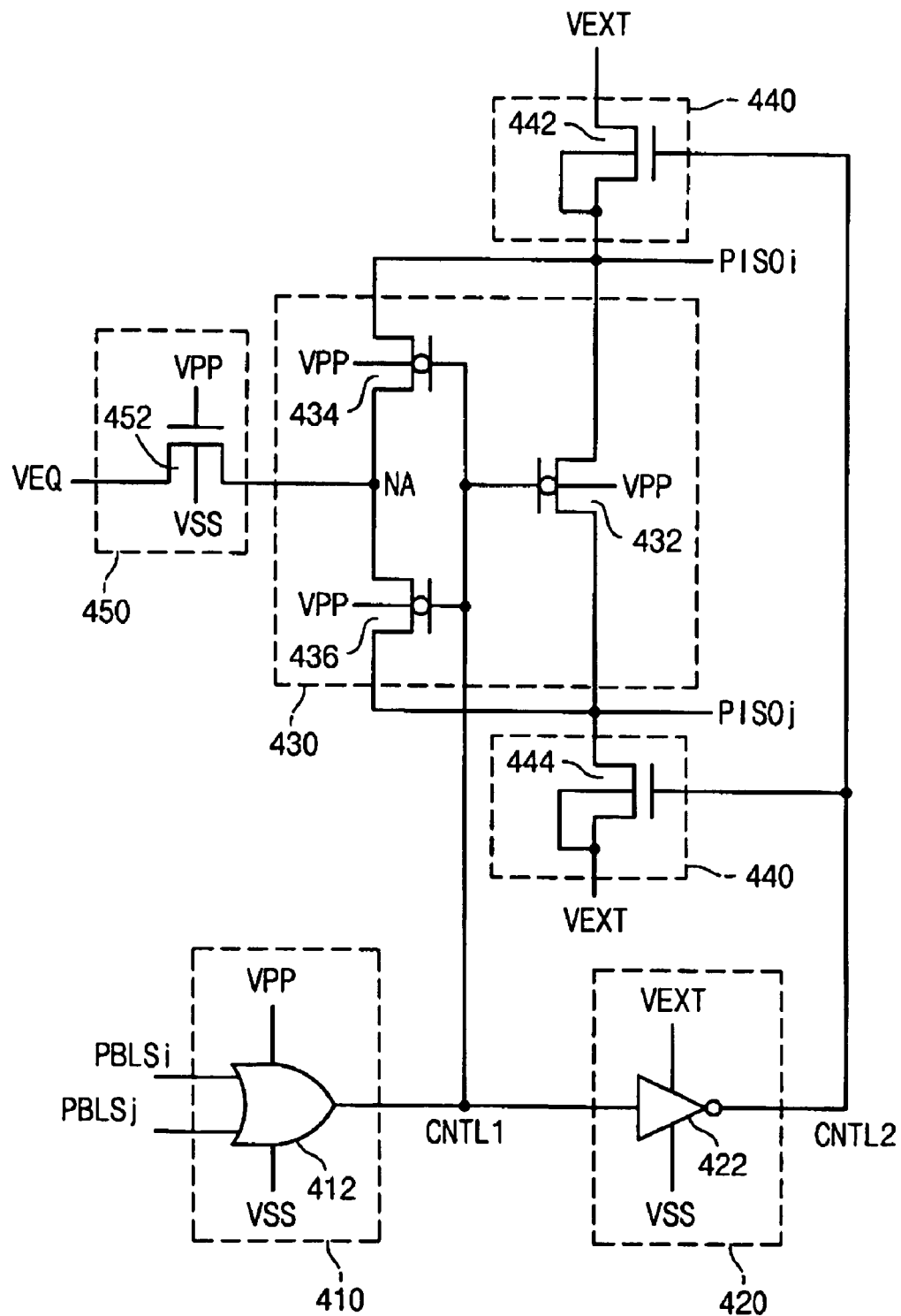
FIG. 4 is a schematic diagram illustrating an isolation signal equalizing circuit according to an exemplary embodiment of the present invention.

FIG. 4 is a schematic diagram illustrating an exemplary embodiment of an isolation signal equalizing circuit 400. In an exemplary embodiment, the isolation signal equalizing circuit 400 may transfer at least a portion of the boost voltage VPP to the output terminal for the bitline equalizing voltage VEQ when the first bitline isolation signal PISOi or the second bitline isolation signal PISOj transitions from, for example, a higher level of VPP to a lower level of VSS. The isolation signal equalizing circuit 400 may include a first controller 410 and a second controller 420 (which may be referred to as "the controller"), an equalizer 430, a driver 440, and a transfer circuit 450.

The first controller 410 may be driven by the boost voltage VPP and may include an OR logic gate 412. The OR gate 412 may generate a lower level first control signal CNTL1, for example, when the first memory block selection signal PBLSi and the second memory block selection signal PBLSj are at a lower level (e.g., a logic '0'), for example, in a non-selection state.

The second controller 420 may be driven by the external voltage VEXT, and may include an inverter 422, which may generate a higher level (e.g., a logic '1') second control signal CNTL2, for example, when the first control signal CNTL1 is at a lower level. The equalizer 430 may include transistors 432, 434, and 436, which may equalize the first and second bitline isolation signals, PISOi and PISOj, for example, in response to the first control signal CNTL1 being set to a lower level.

The driver 440 may include diode-connected transistors 442 and 444, which may be driven by the external voltage VEXT to activate the first and second bitline isolation signals PISOi and PISOj, respectively.

The transfer circuit 450 may include an NMOS transistor 452 whose gate may be coupled to the boost voltage VPP, such that a voltage level at a node NA may be transferred to the output terminal for the equalizing voltage VEQ.

The operation of the isolation signal equalizing circuit 400, according to an exemplary embodiment, will be described below.

In a non-selection state (e.g., a precharge state), the first and second block select signals PBLSi and PBLSj, and the first control signal CNTL1 may be set to a lower level and the second control signal CNTL2 may be set to a higher level.

The second control signal CNTL2 may be at a higher level, and the transistors 442 and 444 of the driver 440 may be on. The first control signal CNTL1 may be at a lower level and the transistors 432, 434, and 436 in equalizer 430 may also be on. The first and second bitline isolation signals PISOi and PISOj may have a voltage level VEQ, which may be supplied via a bitline equalizing voltage generator 900, which is discussed in detail below with respect to FIG. 9.

The operation state may transition from a non-selection state to a selection state (e.g., an active state), and the first memory block 110 and/or second memory block 120 may be selected. When the first memory block 110 is selected, the first and second block selection signals $PBLS_i$ and $PBLS_j$ may be set to a higher level and a lower level, respectively. The first control signal CNTL1 may be set to a higher level and the second control signal CNTL2 may be at a lower level. The first bitline isolation signal generator 301 (shown in FIG. 3A) may set the first bitline isolation signal PISOi to the boost voltage level of VPP, and the second bitline isolation signal generator 302 (shown in FIG. 3B) may set the second bitline isolation signal PISOj to the ground voltage level VSS. The first control signal CNTL1 may be at a higher level and the PMOS transistors 432, 434, and 436 in equalizer 430 may be off. The NMOS transistors 442 and 444 of the driver may be off in response to the second control signal CNTL2, which may be at a lower level.

The operation state may transition from the selection state to the non-selection state, and the transistor 444 may be turned on such that the bitline isolation signal PISOj transitions from VSS to the external voltage VEXT, however, the transistor 442 may remain at VSS, and remain off. The equalizer 430 may be turned on such that at least a portion of the charge of the bitline isolation signal PISOi, which may be at VPP, may be transferred to bitline equalizing voltage generator 900 via transistor 452. Bitline isolation signal PISOj may transition to a value of VEQ, for example, via transistor 452.

Referring to FIG. 1 the NMOS transistors 117 and 118 of the bitline isolation circuit 116 may be switched on in response to the first bitline isolation signal PISOi being set to the boost voltage VPP, and a data bit stored in the memory cell MC0 may be detected by the sense amplifier 130.

The data sensing operation may be complete, the first memory block 110 may not be selected, and the block selection signal PBLSi may transition to a lower level. The first control signal CNTL1 may be at a lower level of VSS and the second control signal may be at a higher level of VEXT, for example, in a non-selection state, that is, when the first and second memory block select signals, PBLSi and PBLSj are at lower levels.

As the first and second control signals CNTL1 and CNTL2 transition, the first bitline isolation signal PISOi may have a boost voltage level VPP and the second bitline isolation signal PISOj may have the ground voltage level VSS. The second control signal CNTL2 of the external voltage level VEXT may be applied to the driver 440, and the first and second NMOS transistors 442 and 444 may be turned off and on, respectively.

The transistors, 432, 434, and 436, of the equalizer 430 may be turned on in response to the first control signal CNTL1 transitioning to the ground voltage level VSS. The voltage level of the node NA may transition to an intermediate level between the voltage levels of the first bitline isolation signal PISOi (VPP) and the second bitline isolation signal PISOj (VSS). The voltage level of the node NA, which may be substantially VPP/2, may be transferred to the output terminal for the equalizing voltage VEQ through the transfer circuit 450.

The isolation signal equalizing circuit 400 may output an equalizing voltage VEQ, for example, using charges supplied from the boost voltage VPP, while the first bitline isolation signal generator in FIG. 3A may cause the first bitline isolation signal PISOi to transition from the boost voltage VPP to the ground voltage level VSS. The voltage VEQ transferred from node NA may begin to decline.

The second memory block 120 may be selected and the transistors 432, 434, and 436 of the equalizer 430, and the transistors 442 and 444 of the driver 440 may be turned off.

The second bitline isolation signal generator shown in FIG. 3B may cause the second bitline isolation signal PISOj to transition to a higher level of VPP and the second memory block 120 may be connected (e.g., electrically) with the sense amplifier 130. The first memory block 110 may be isolated (e.g., electrically isolated) from the sense amplifier 130 due to, for example, the first bitline isolation signal PISOi shown in FIG. 3A maintaining a lower level of VSS.

The second memory block 120 of FIG. 1 may not be selected, the second memory block selection signal PBLSj may be deactivated, that is, set to a lower level of VSS and the bitline equalizing voltage VEQ may be set to the intermediate voltage level (e.g., substantially VPP/2) between the ground voltage of the first bitline isolation signal PISOi and the boost voltage VPP of the second bitline isolation signal PISOj. This may occur based on the same, or substantially the same, principles of operation for the bitline equalizing voltage generator 400 as described above in the case where the first memory block 110 may no longer be selected and the signal PBLSi transitions from a high to low level.

The equalizing voltage VEQ may be established by using charges, which may be supplied from the boost voltage VPP, while the second bitline isolation signal PISOj transitions from the boost voltage level VPP to the ground voltage level VSS, for example, based on the operation of the second bitline isolation signal generator 302 of FIG. 3B.

Figure 5A:
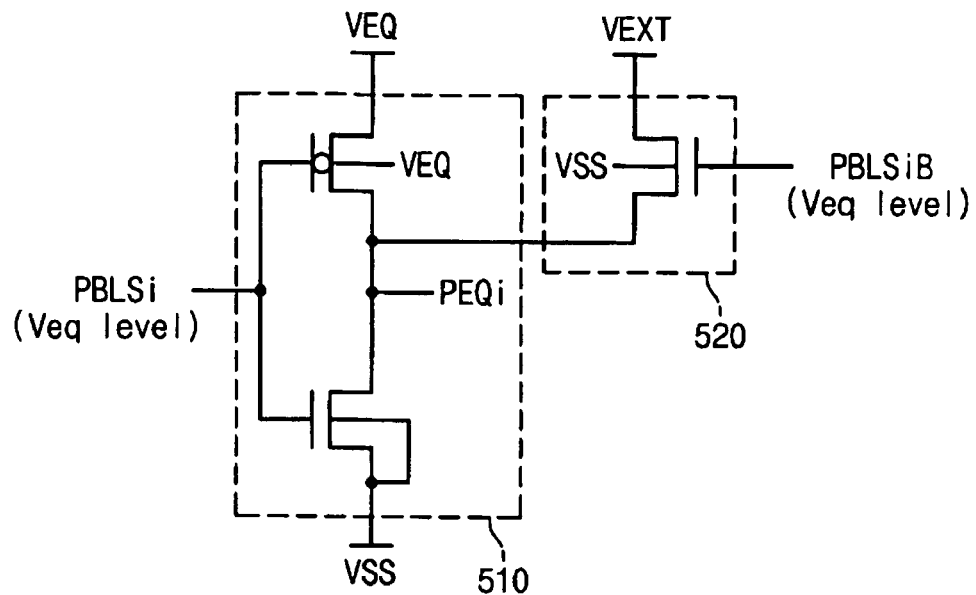
FIGS. 5A and 5B are schematic diagrams illustrating bitline equalizing signal generators according to an exemplary embodiment of the present invention.
Figure 5B:
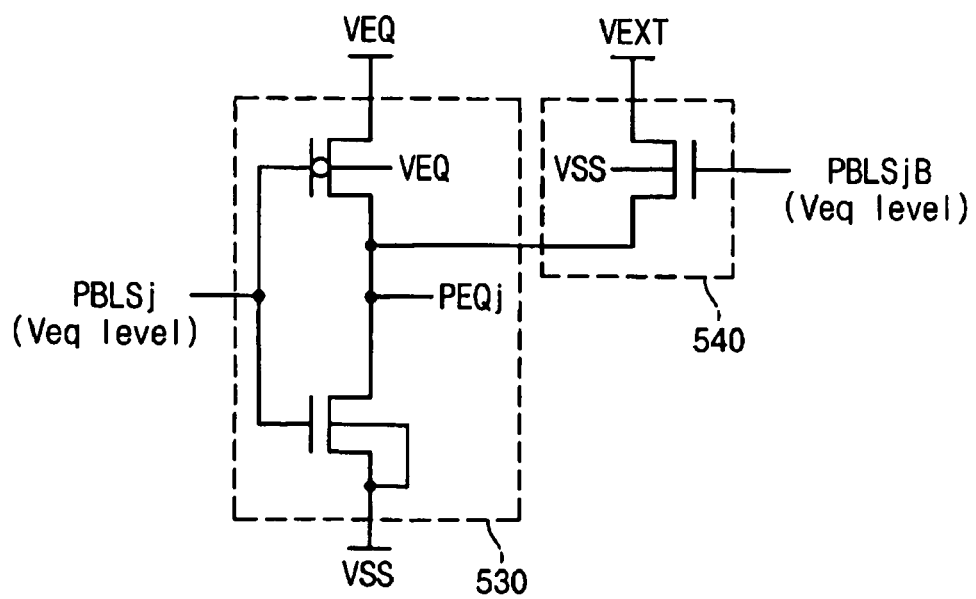

FIGS. 5A and 5B illustrate schematic diagrams of exemplary embodiments of the first and second bitline equalizing signal generators 501 and 502, respectively. The first bitline equalizing signal generator 501 of FIG. 5A may include a first driver 510 for applying the bitline equalizing voltage level VEQ to the output terminal for the first bitline equalizing signal PEQi, for example, when the first memory block selection signal PBLSi may be at a lower level. The first bitline equalizing signal generator may further include a second driver 520 for applying the first bitline equalizing signal PEQi charged with the external voltage level VEXT, for example, when the first complement block selection signal PBLSiB may be at a higher level.

The first driver 510 may be connected between the bitline equalizing voltage VEQ and the ground voltage VSS, and may include an inverter, which may couple the first memory block selection signal PBLSi to a gate of an NMOS transistor. The first driver 510 may be apply VEQ to the output terminal for the first bitline equalizing signal PEQi based on the voltage level of the first memory block selection signal PBLSi.

The second driver 520 may be connected between the external voltage VEXT and the ground voltage VSS. The second driver 520 may include an NMOS transistor. A gate of the NMOS transistor may be coupled to the first complement block selection signal PBLSiB.

The first memory block selection signal PBLSi may be at a higher level and the first bitline equalizing signal PEQi may transition to a lower level of VSS, which may inhibit the bitlines BL/BLB of the first memory block 110 from being precharged. A sensing operation may be performed for the selected memory cell starts using the bitline of first memory block 110, which may be connected to the sense amplifier circuit 130.

The first memory block 110 may not be selected and the first selection signal PBLSi may be at a lower level. The first bit equalizing signal PEQi may be driven by the driving voltage of the first driver 510 (e.g., bitline equalizing voltage VEQ) or by the driving voltage of the second driver 520 (e.g., external voltage VEXT). The signal PEQi may be driven by the larger of VEQ and VEXT. The first bitline equalizing signal PEQi may be raised to the higher level and may cause the first bitline equalizing circuit 112 to precharge the bitlines BL/BLB of the first memory block 110.

The first bitline equalizing signal PEQi may be raised to a higher level more rapidly by recycling or reusing the charge (or voltage) supplied from the boost voltage VPP of the first bitline isolation signal PISOi, which may be supplied as the bitline equalizing voltage VEQ from isolation signal equalizing circuit 400 of FIG. 4.

The external voltage VEXT may not be at a sufficient level (e.g., because the memory device 100 may be operating under a low voltage environment) and the bitlines BL/BLB of the first memory block 110 of FIG. 1 may be pre-charged, for example, because the first bitline equalizing signal PEQi may be supplied with the bitline equalizing voltage VEQ. The VEQ may be charged to a level of VPP/2, which may be higher than the external voltage VEXT under low voltage conditions and of a sufficient voltage level to make the NMOS transistors 113 and 114 of the bitline equalizing circuit 112 conductive.

FIG. 5B illustrates an exemplary embodiment of the second bitline equalizing signal generator 502. The second bitline equalizing signal generator 502 may have a structure and an operation, which may be similar to that described above with respect to the first bitline equalizing signal generator shown in FIG. 5A. A detailed description of the circuit's 502 structure and operation will not be repeated.

The second memory block 120 may be selected and the second bitline equalizing signal PEQj may be set to a lower level of VSS, which may cause the second bitline equalizing signal PEQj to be driven by the bitline equalizing voltage VEQ or the external voltage VEXT.

Figure 6:
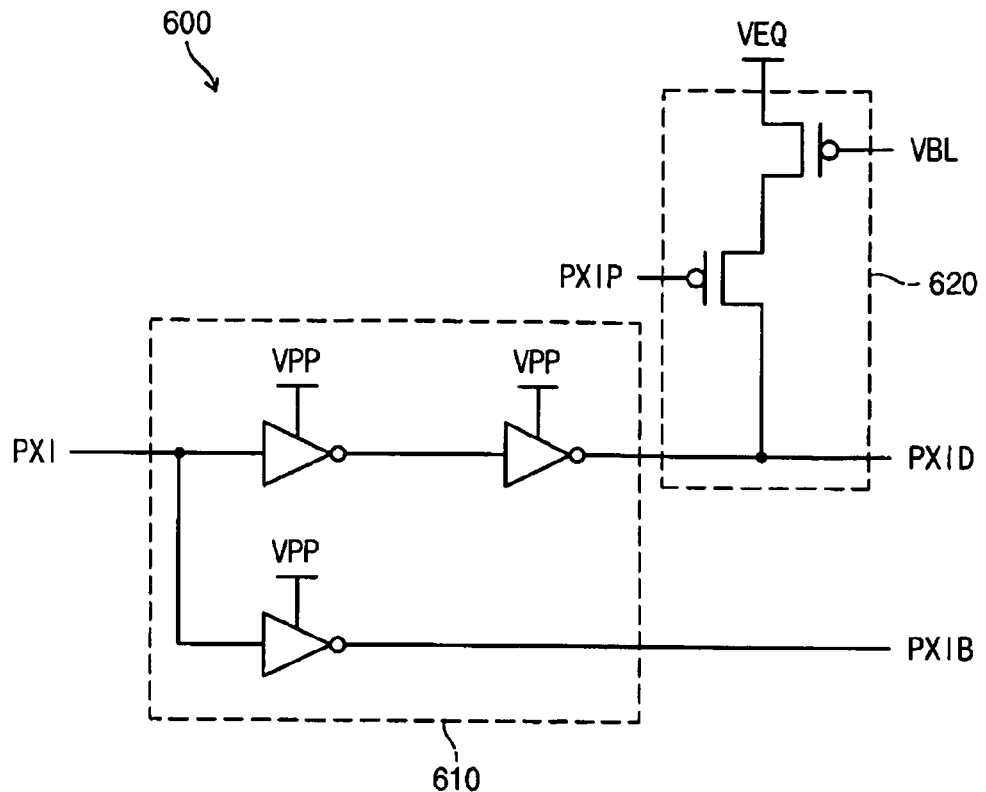
FIG. 6 is a schematic diagram illustrating a wordline driver signal circuit according to an exemplary embodiment of the present invention.

FIG. 6 is a schematic diagram illustrating an exemplary embodiment of the wordline driver signal circuit 600. The wordline driver signal circuit 600 may include a word line drive signal generator 610 and an equalizing voltage generator 620. The word line drive signal generator 610 may receive a row address signal PXI from a row decoder (not shown), and may use the received signal PXI to generate a wordline drive signal PXID and a word line reset signal PXIB, which may be driven by the boost voltage VPP.

Figure 7:
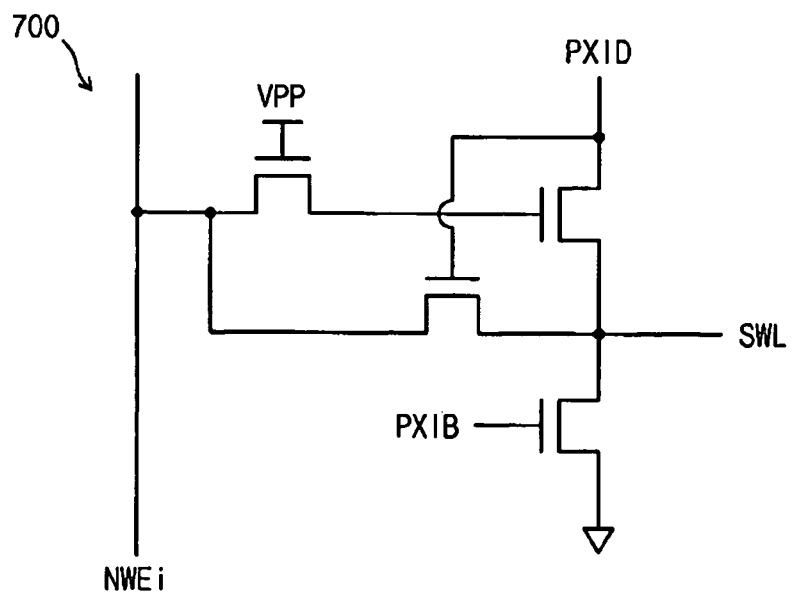
FIG. 7 is a schematic diagram showing an exemplary embodiment of a sub-wordline driver.

The wordline drive signal PXID and the wordline reset signal PXIB may be applied to the sub-wordline driver 700 of FIG. 7, and may activate a sub-wordline signal SWL to a higher level of boost voltage VPP. The sub-wordline driver 700, for example, in response to a wordline enable signal NWEi supplied from a main wordline driver (not shown) and the wordline drive signal PXID, may activate the sub-wordline SWL with the boost voltage VPP and may enable the wordline of a memory cell coupled to the sub-wordline SWL. The sub-wordline driver 700 may disable the wordline of the memory cell, for example, by resetting the sub-wordline SWL in response to the wordline reset signal PXIB being at a higher level.

Referring to FIG. 6, the bitline equalizing voltage driver 620, for example, in response to the bitline precharge voltage VBL and a wordline drive pulse signal PXIP, and drive the bitline equalizing voltage VEQ to the wordline drive signal PXID, which may be generated from the wordline drive signal generator 610 to a level of the boost voltage VPP. The wordline drive pulse signal PXIP may be a pulse-type signal, which may be produced, for example, when the row address PXI transitions from a higher level to a lower level.

The bitline equalizing voltage driver 620 may transfer the boost voltage VPP of the wordline drive signal PXID to the bitline equalizing voltage VEQ output terminal, for example, during a lower pulse duration of the wordline drive pulse signal PXIP. The bitline equalizing voltage driver 620 may output the wordline drive signal PXID as the bitline equalizing voltage.

The bitline equalizing voltage VEQ may recycle or reuse the charge of the boost voltage VPP, which may be supplied from the voltage level of the wordline drive signal PXID, when the wordline drive signal PXID may transition from a higher level to a lower level in response to the row address PXI being at a lower level.

Figure 8:
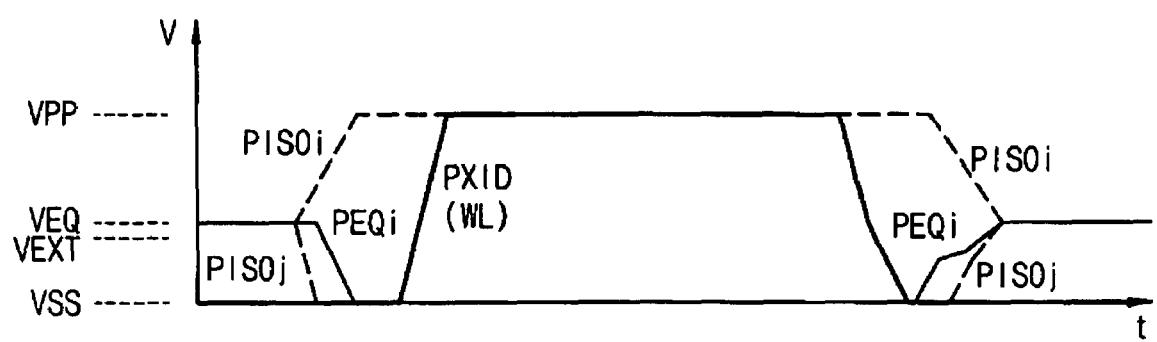
FIG. 8 illustrates examples of the voltage levels of a wordline signal, isolation signals, and equalizing signals, during the operation of a memory device, which may include the bitline equalizing voltage generator illustrated in FIG. 6.

FIG. 8 illustrates examples of voltage levels of exemplary embodiments of the first bitline equalizing signal PEQi and first and second isolation signals PISOi and PISOj during a sensing operation of a memory cell in a first memory block 110 of a semiconductor memory device 100. FIG. 8 illustrates an exemplary embodiment in which the memory device 100 may utilize the wordline driver signal circuit 600 of FIG. 6.

Figure 2:
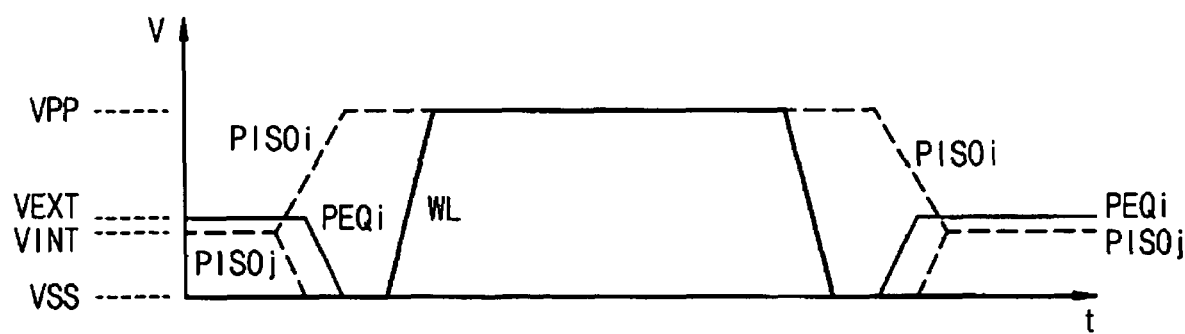
FIG. 2 illustrates an example of the voltage levels of a wordline, isolation signals, and equalizing signals, during the operation of the circuit shown in FIG. 1.

Referring to FIG. 8, the first memory block 110 in the memory device 100 may be selected and the first bitline equalizing signal PEQi may transition from a higher level, supplied by the bitline equalizing voltage PEQi, to a lower level of ground voltage VSS, the first bitline isolation signal PISOi may be set to a higher level of boost voltage VPP, the second bitline isolation signal PISOj may be set to a lower level of VSS, and a wordline drive signal PXID of the first memory block 110 may be set to the boost voltage VPP (as shown in FIG. 8, PXID corresponds to the wordline signal WL of FIG. 2 because it may represent a voltage level of the wordline).

As the wordline drive signal PXID (which may correspond to wordline signal WL) may be disabled, the boost voltage VPP of the signal PXID may be transferred to the first bitline equalizing signal PEQi, such that the first bitline equalizing signal PEQi may rise to the bitline equalizing voltage VEQ. The first and second bitline isolation signals PISOi and PISOj may converge to the bitline equalizing voltage VEQ.

The wordline drive signal PXID may be disabled and a charge recycled from the boost voltage VPP may be used as the activation level of bitline equalizing voltage VEQ to which the first bitline equalizing signal PEQi may be raised. The activation level of VEQ may be higher than the voltage level (e.g., external voltage VEXT) which may be used by conventional DRAM devices, as the activation level of the bitline equalizing signal PEQi, as illustrated in FIG. 2.

According to an exemplary embodiment, a second bitline equalizing voltage generator may utilize an intermediary bitline equalizing voltage VEQ1, which is generated by a bitline equalizing voltage generator 900, to output a final bitline equalizing voltage VEQ2.

Figure 9:
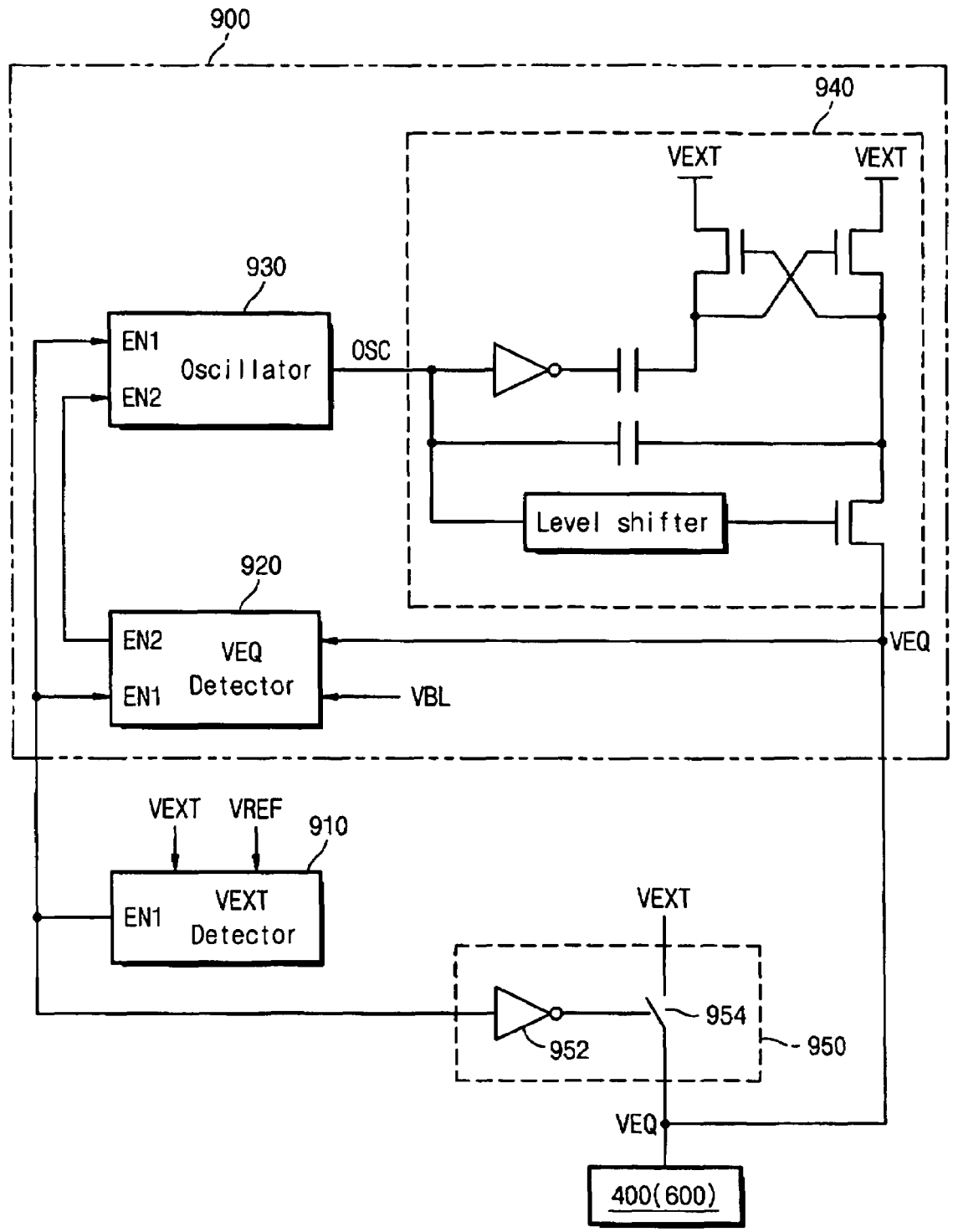
FIG. 9 is schematic diagram illustrating a bitline equalizing voltage generator according to another exemplary embodiment of the present invention.

Referring to the FIG. 9, the bitline equalizing voltage generator 900 includes a charge pumping circuit 940 and an external voltage detector 910. The bitline equalizing voltage generator 900 may further include a bitline equalizing voltage detector 920, an oscillator 930, and a switch circuit 950. The bitline equalizing voltage generator 900 may generate a bitline equalizing voltage VEQ by recycling (or reusing) the charge supplied by the boost voltage VPP to at least one of the bitline isolation signal PISOi (similar to that as illustrated in FIG. 4) or the word line drive signal PXID (similar to that as illustrated in FIG. 6). The bitline equalizing voltage VEQ generated by the bitline equalizing voltage generator 900 may be referred hereafter as an "intermediary bitline equalizing voltage" VEQ1.

The external voltage detector 910 may compare a reference voltage VREF with the external voltage VEXT. If the external VEXT is greater than the reference voltage VREF, the VEXT detector 910 may output a first enable signal EN1. If the external voltage VEXT is less than the reference voltage VREF, the VEXT detector 910 may output a first enable signal EN1 with a higher level. As illustrated in FIG. 9, the voltage VEXT and the voltage VEQ may be connected via a switch 950, for example, in response to the first enable signal EN1, which may be inverted by inverter 952. The external voltage detector 910 is described in further detail below according to an exemplary embodiment as illustrated in FIG. 10 below.

Figure 10:
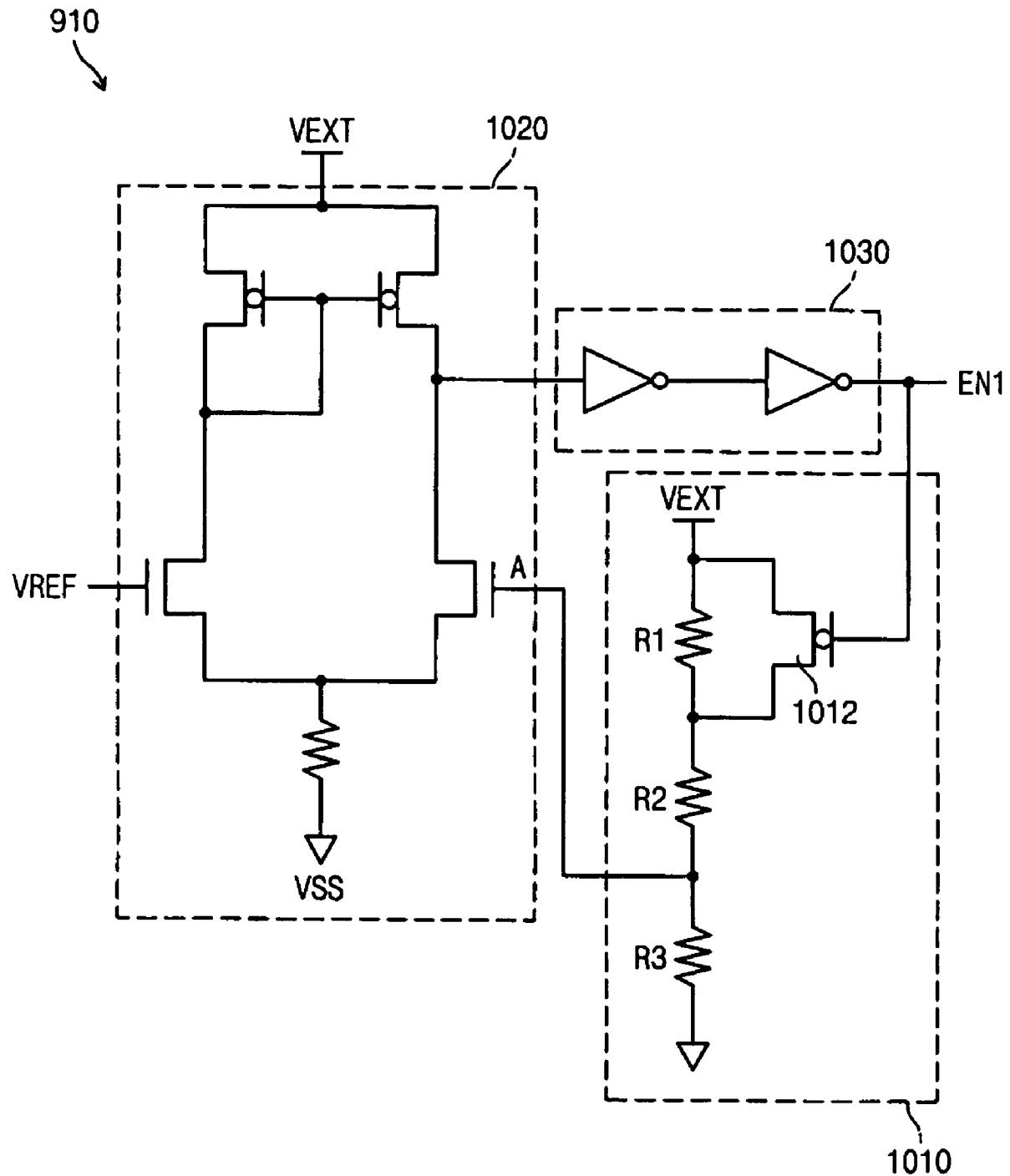
FIG. 10 is a schematic diagram providing another illustration of an external voltage detector according to another exemplary embodiment of the present invention illustrated in FIG. 9.

Referring to FIG. 10, the external voltage detector 910 may include a voltage divider 1010, a comparator 1020, and a driver 1030. The voltage divider 1010 may include a first resistor R1, a second resistor R2, and a third resistor R3, which may be connected in series between terminals at which the external voltage VEXT and the ground voltage VSS may be applied. A PMOS transistor 1012 may be connected in parallel with the first transistor R1, such that the transistor's 1012 gate may receive the first enable signal EN1. (PMOS transistor 1012 may be referred to hereafter as "parallel transistor"). The first resistor R1 may have a higher, or substantially higher, resistance than the second and/or third resistors R2 and/or R3, which may have the same, or substantially the same, resistance.

The first enable signal EN1 may be at a lower level and the output node A of the external voltage divider 1010 may have a voltage level, which may be half of the voltage level of the applied external voltage VEXT, for example, VEXT/2. The first enable signal EN1 may be at a higher level and the output node A of the external voltage divider 1010 may have a voltage, for example, lower than half voltage of external voltage VEXT, which may be a result of the operation of the parallel transistor 1012.

The comparator 1020 may compare a reference voltage VREF with the voltage at output node A on the voltage divider 1010, and may generate the first enable signal EN1 through the driver 1030. The reference voltage VREF may be half of a normal operating voltage level of the external voltage VEXT.

The external voltage detector 910 may operate as follows. The external voltage VEXT may decrease below a normal operating voltage level and the comparator 1020 may generate the first enable signal EN1 at a higher level, for example, as a result of a comparison between the voltage level of output node A of voltage divider 1010, which may be lower than half of a normal operating level of VEXT, with the reference voltage VREF, which may be half of the normal operating level of VEXT.

The external voltage VEXT may rise (e.g., according to the operation of the charge pumping circuit 940 described below), the voltage level of output node A, may rise above half of a normal operating level of VEXT and the output of the comparator 1020 may generate the first enable signal EN1 at a lower level. The first enable signal EN1 may be at a lower level and the PMOS transistor 1012 of the voltage divider 1010 may be turned on. The level of the output node A may become, for example, VEXT/2 and the first enable signal EN1 may be held at a lower level.

Figure 11:
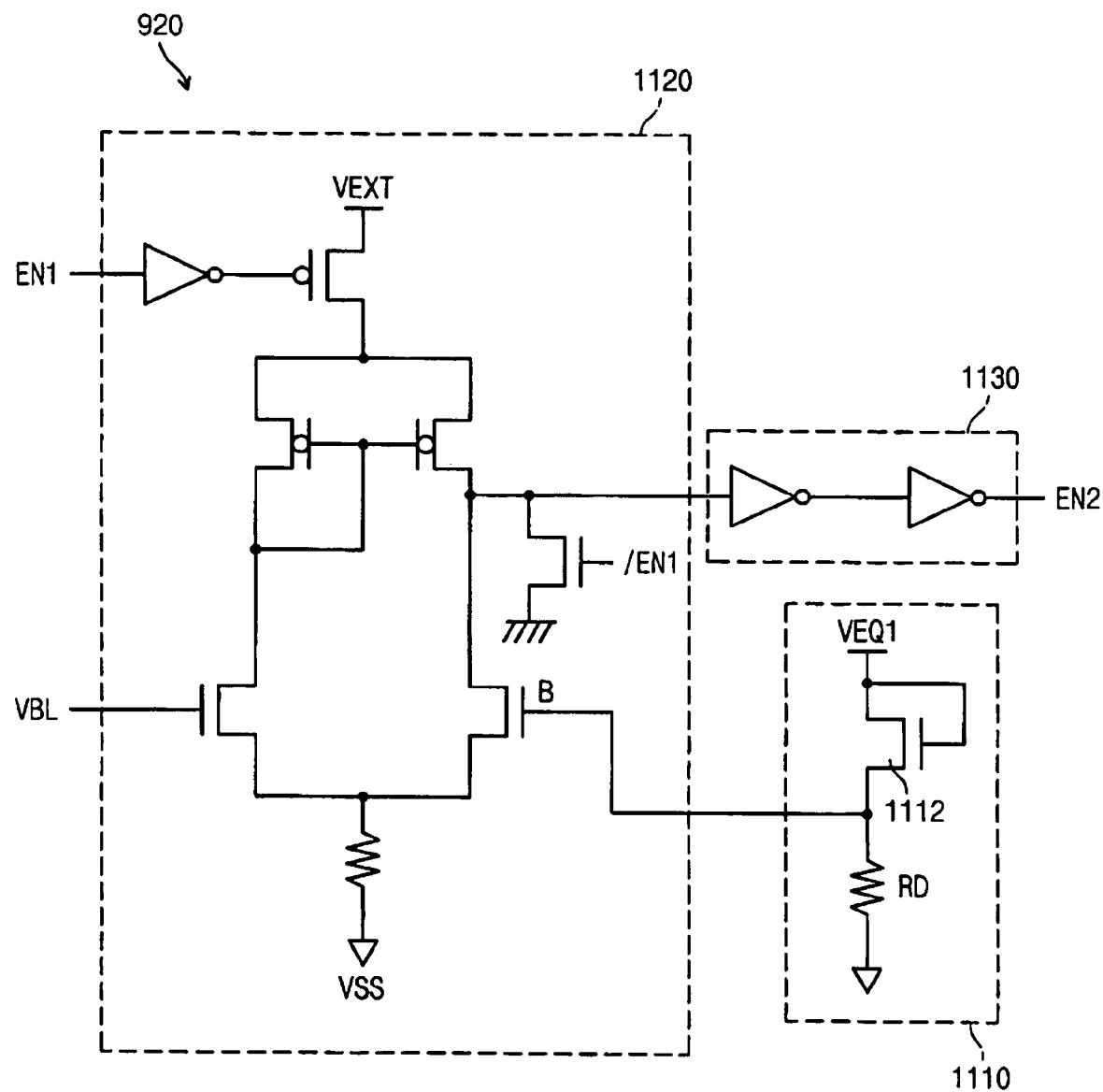
FIG. 11 is a schematic diagram providing another illustration of a bitline equalizing voltage detector according to another exemplary embodiment of the present invention illustrated in FIG. 9.

FIG. 11 is a schematic diagram illustrating an exemplary embodiment of the bitline equalizing voltage detector 920 of FIG. 9 in more detail. Referring to FIG. 11, the bitline equalizing voltage detector 920 may include a bitline equalizing voltage down-converter 1110, a comparator 1120, and a driver 1130. The bitline equalizing voltage down-converter 1110 may include a resistor RD and a diode-connected NMOS transistor 1112, which may be connected (e.g., serially connected) between terminals at which the intermediary bitline voltage VEQ1 and the ground voltage VSS may be applied. The NMOS transistor 1112 may have a higher threshold voltage Vth. The output node B of the bitline equalizing voltage down-converter 1110 may produce a voltage, which may be equal to the difference between the intermediary bitline equalizing voltage VEQ1 and a threshold voltage Vth of an NMOS transistor (e.g., a voltage level of VEQ1−Vth). The first enable signal EN1 may be at a higher level and the comparator 1120 may compare a bitline level VBL with the node B level. The first enable signal EN1 may be at a lower level and the comparator 1120 may be at a lower level. The output of the comparator 1120 may generate a second enable signal EN2 through the driver 1130.

The intermediary bitline equalizing voltage level VEQ1 may decrease below a threshold and the voltage level of output node B may be lower than the bitline voltage VBL such that the comparator 1120 may output a higher level signal. The second enable signal EN2 may transition to a higher level. The intermediary bitline equalizing voltage VEQ1 may rise to a level higher than bitline voltage level VBL, for example, by more than the threshold voltage level Vth (i.e., VEQ1 becomes higher than VBL+Vth), the voltage level of the output node B may be higher than the bitline voltage VBL. The output of the comparator 1129 may transition to a lower level and the second enable signal EN2 may be output at a lower level.

Figure 12:
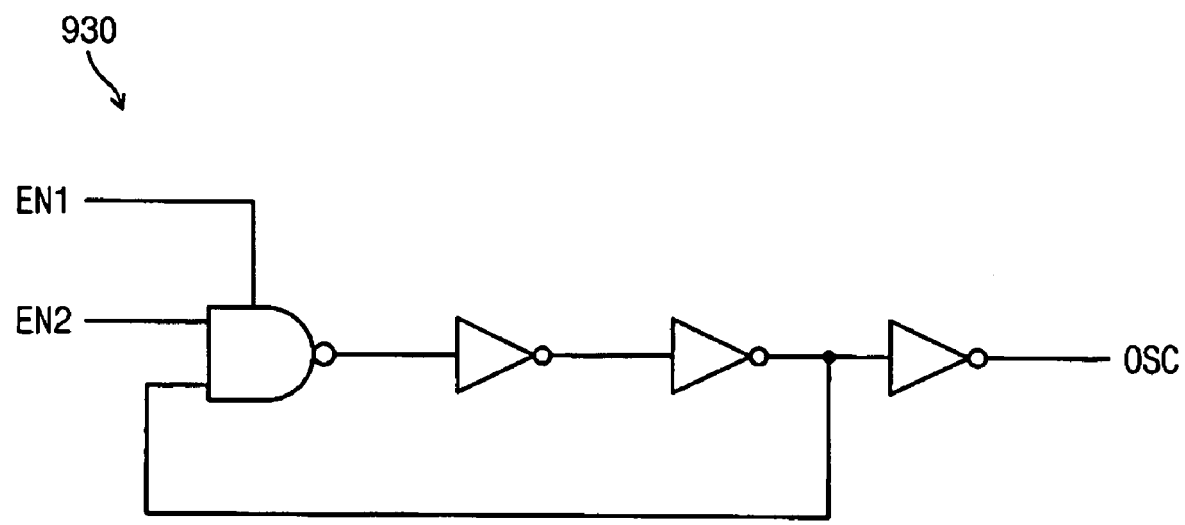
FIG. 12 is a schematic diagram providing another illustration of an oscillator according to another exemplary embodiment of the present invention illustrated in FIG. 9.

FIG. 12 is a schematic diagram illustrating an exemplary embodiment of the oscillator of FIG. 9. Referring to FIG. 12, the oscillator 930 may include a NAND gate, which may be driven by the first enable signal EN1 and may receive the second enable signal EN2. The output of the NAND gate may be delayed and fed back as another input to the NAND gate. The oscillator 930 may generate an oscillation signal OSC in response to the first and second enable signals, EN1 and EN2.

As shown in FIG. 9, the charge pumping circuit 940 in the bitline equalizing voltage generator 900 may generate the bitline equalizing voltage VEQ, for example, by pumping the external voltage VEXT in response to the oscillation signal OSC.

The external voltage VEXT may decrease below a normal voltage level (e.g., when the semiconductor memory device 100 starts operating under low voltage conditions) and the first enable signal EN1 output by the external voltage detector 910 may be set to a higher level. The higher level EN1 may cause the output of inverter 952 in switch circuit 950 to be set to a lower level.

The switch 954 may connect the external voltage VEXT to the output terminal VEQ2 of the second bitline equalizing voltage generator 900 in response to a higher level input signal. A lower level input signal may cause the switch 954 to connect the intermediary bitline equalizing voltage VEQ1.

The lower level signal output by the inverter 952 may cause the switch 954 to disconnect the external voltage 954 from the output terminal for VEQ2, in favor of the intermediary bitline equalizing voltage signal. The intermediary bitline equalizing voltage VEQ1 may be output as the final bitline equalizing voltage VEQ2. The final bitline equalizing voltage VEQ2 may be sent to the VEQ input of the first and second bitline equalizing signal generators 501 and 502 (in FIGS. 5A and 5B).

The bitline equalizing voltage detector 920 may determine that the intermediary bitline equalizing voltage VEQ may decrease below a level of the sum of the bitline precharge voltage VBL and a threshold voltage Vth of NMOS transistor 1112 and the second enable signal EN2 may output at a higher level. The higher level of second enable signal EN2 may indicate that the intermediary equalizing voltage VEQ1 may not be sufficient to turn on a transistor in the bitline equalizing circuits 112 and 122 (e.g., because VEQ1<VBL+Vth).

The first and second enable signals, EN1 and EN2, may have a higher level and the oscillator 930 may generate the oscillation signal OSC. The charge pumping operation of the charge pump circuit 940 may pump up the external voltage VEXT, for example, based on the oscillation signal OSC. The bitline equalizing signal generators 501 and 502 may output a higher of the received inputs VEQ2 and VEXT and the charge pumping of the external voltage VEXT may enable the circuits 501 and 502 to output a higher level bitline equalizing signal PEQi or PEQj, which may activate the corresponding bitline equalizing circuit 112 or 122.

Figure 13:
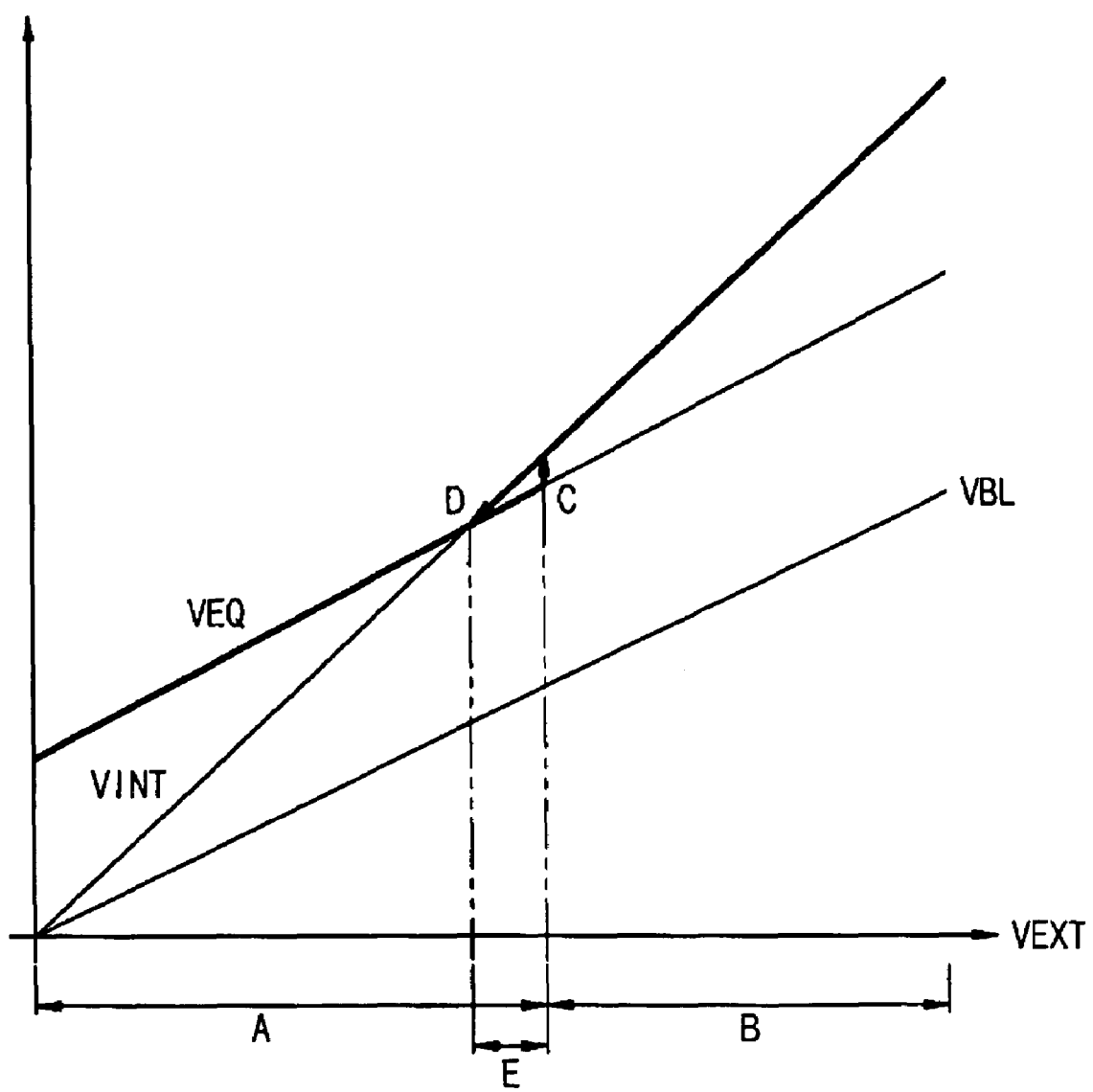
FIG. 13 illustrates examples of the voltage levels of various signals during the operation of the bitline equalizing voltage generator illustrated in FIG. 9.

FIG. 13 illustrates examples of the voltage levels of various signals during the operation of the bitline equalizing voltage generator illustrated in FIG. 9. Referring to FIG. 13, the intermediary bitline equalizing voltage VEQ1 may be higher than the bitline precharge voltage VBL by at least a portion of the threshold voltage Vth. The external voltage may be lower than a normal operating level, for example, 2*VREF. The final bitline equalizing voltage VEQ2 may be output to the same, or substantially the same, level as the intermediary bitline equalizing voltage VEQ1. As shown in FIG. 13, the external voltage VEXT may increase during period Ta to a level higher than a normal operating level of, for example, 2*VREF at point Tb. The first enable signal EN1 may be output by the external voltage detector 910 at a lower level, which may cause switch 954 to connect the external voltage VEXT to the output terminal for VEQ2.

At point Tb of FIG. 13, the voltage level of the final bitline equalizing voltage VEQ2 may track the level of the external voltage VEXT during the period of Tc.

As shown in FIG. 13, the external voltage VEXT may decrease and the final bitline equalizing voltage VEQ2 may decrease.

At point Td, the external voltage VEXT may decrease below a normal level of 2*VREF and the external voltage detector 910 may output the first enable signal EN1 at a higher level, which may cause the external voltage detector 910 to output the first enable signal EN1 at a higher level. The switch 954 may apply the intermediary bitline equalizing voltage VEQ1 to the output terminal for the final bitline equalizing voltage EQ2.

The bitline equalizing voltage detector 920 may be enabled by the higher level first enable signal EN1. The intermediary bitline equalizing voltage VEQ1 may decrease, for example, below VBL+Vth and the charge pumping circuit 940 may be activated to ensure that higher levels of the first and second bitline equalizing signals PEQi and PEQj may activate the first and second bitline equalizing circuits 112 and 122, respectively.

As described above with respect to FIG. 13, the final bitline equalizing voltage VEQ2 may have a hysteresis characteristic, such that it may be adaptable to the fluctuations of the external voltage VEXT.

Figure 14:
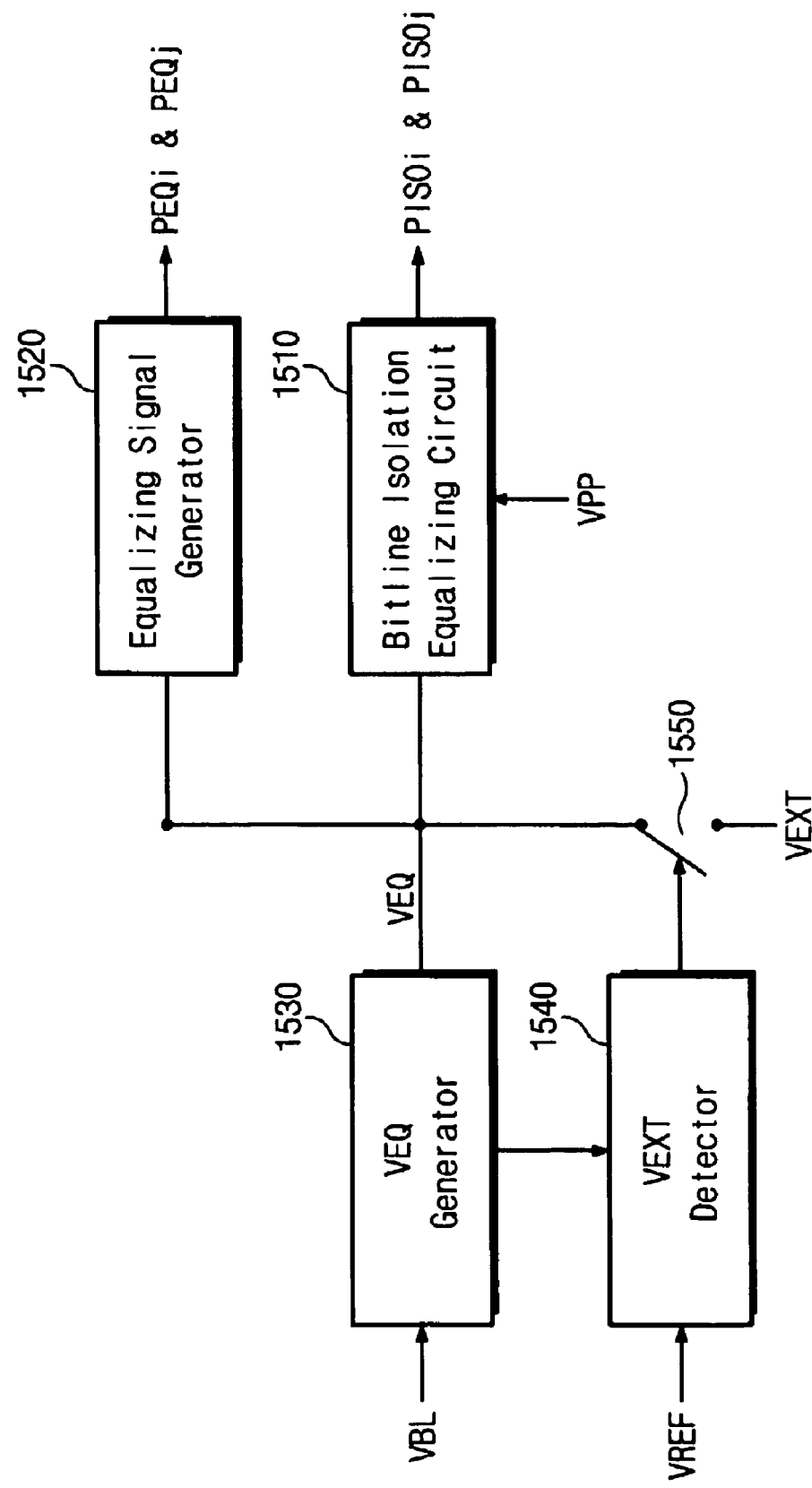
FIG. 14 illustrates an example of the connection between the exemplary embodiments of the memory device of FIG. 1, the bitline isolation signal generators of FIGS. 3A and 3B, the isolation signal equalizing circuit of FIG. 4, and the bitline equalizing signal generators of FIGS. 5A and 5B.

FIG. 14 illustrates an example of the interconnection of the exemplary embodiments of a bitline equalizing voltage generator 1530, a bitline equalizing signal generator 1520, a bitline isolation signal equalizing circuit 1510 and an external voltage detector 1540. The bitline equalizing voltage generator 1530 may operate in the same, or substantially the same, manner as the bitline equalizing voltage generator 900. The bitline equalizing signal generator 1520 may operate in the same or substantially the same manner as the bitline equalizing signal generators 501 and/or 502, as illustrated in FIGS. 5A and/or 5B. The bitline isolation signal equalizing circuit 1510 may operated in the same, or substantially the same, manner as the bitline isolation equalizing circuit 400 of FIG. 4. The external voltage detector 1540 may operate in the same, or substantially the same, as the external voltage detector 910 of FIG. 9.

With regard to FIG. 14, the voltage VEXT may be less than a reference voltage VREF, and the bitline equalizing voltage generator 1530 may generate a bitline equalizing voltage VEQ. The bitline equalizing voltage VEQ may be supplied to the bitline equalizing signal generator 1520 and the bitline isolation signal equalizing circuit 1510. A boost voltage VPP may also be supplied to the bitline isolation signal equalizing circuit 1510.

The memory device may be in an active state, and the bitline isolation signal equalizing circuit 1510 may output a bitline isolation signal PISOi, which may have a voltage VPP, and a bitline isolation signal PIOSj, which may have a voltage VSS. The bitline equalizing signal generator 1520 may output a bitline equalizing signal PEQi, which may have a voltage VSS, and a bitline equalizing signal PEQj, which may have a bitline equalizing voltage VEQ.

The bitline isolation signal PISOi may transition from the boost voltage VPP to the bitline equalizing voltage VEQ, the bitline isolation signal PIOSj may transition from the voltage VSS to the bitline equalizing voltage VEQ, the memory device may transition to a pre-charge (or non-selection) state, and the remaining boost VPP in the bitline isolation signal PISOi may be transferred to the bitline equalizing signal PEQi. That is, the memory device may transition from an active state to a pre-charge (or non-selection) state, and the boost voltage VPP may be reused (recycled) to charge the bitline equalizing signal PEQi to the bitline equalizing voltage VEQ.

The external voltage VEXT may be larger than the reference voltage VREF, the switch 1550 may be turned on, external voltage VEXT may be connected to the bitline equalizing voltage VEQ, and the bitline equalizing voltage generator 1530 may not operate.

Figure 15:
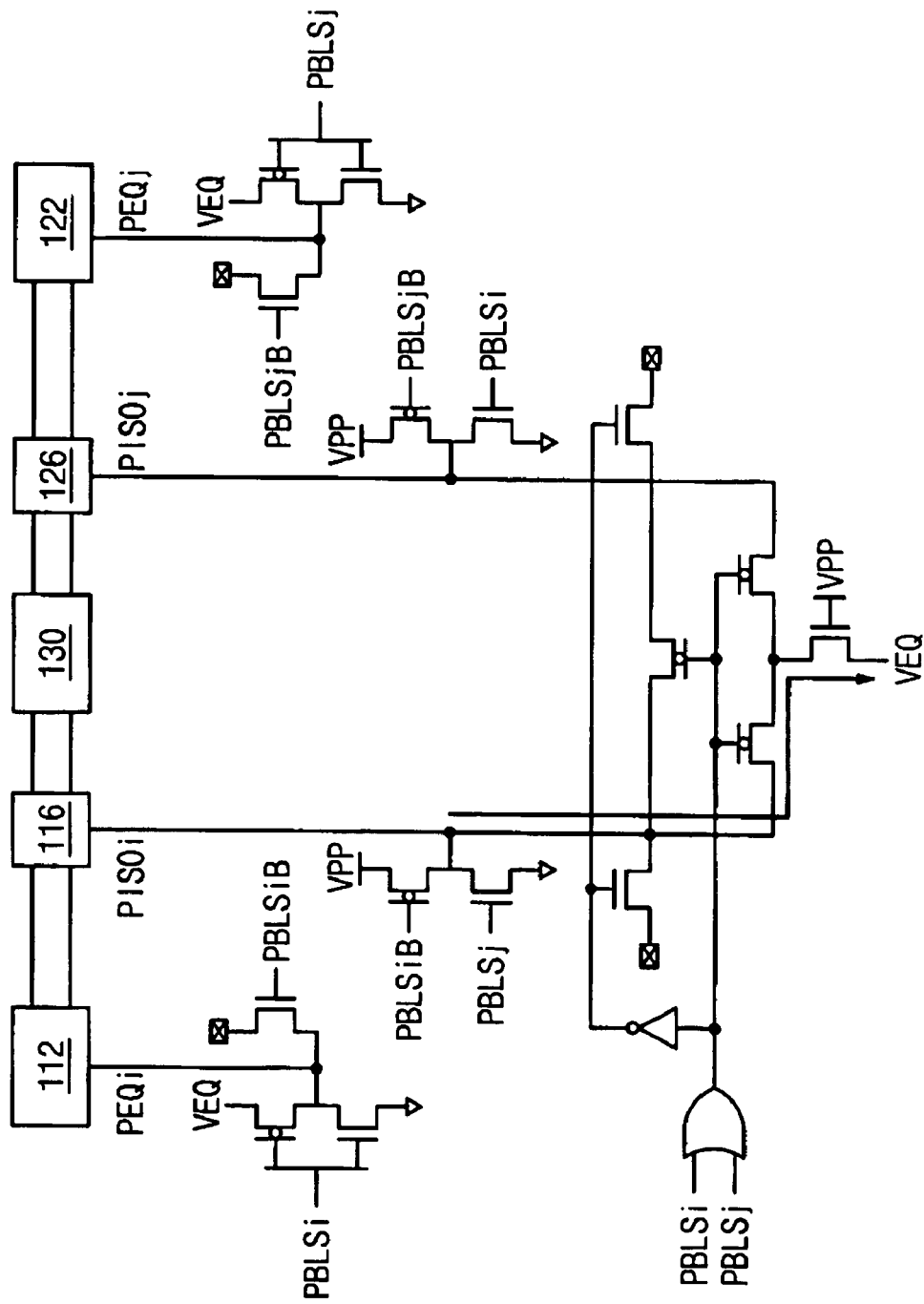
FIG. 15 illustrates an example of the interconnection of the exemplary embodiments of an equalizing voltage generator, an equalizing signal generator, an isolation signal equalizing circuit and a VEXT detector.

FIG. 15 illustrates an example of the connection between the exemplary embodiments of the memory device of FIG. 1, the bitline isolation signal generators of FIGS. 3A and 3B, the bitline isolation signal equalizing circuit of FIG. 4, and the bitline equalizing signal generators of FIGS. 5A and 5B.

The bitline isolation signal PSIOi may transition from the boost voltage VPP to the bitline equalizing voltage VEQ, and the boost voltage VPP may be reused (recycled) to charge to the bitline equalizing voltage VEQ.

Figure 16:
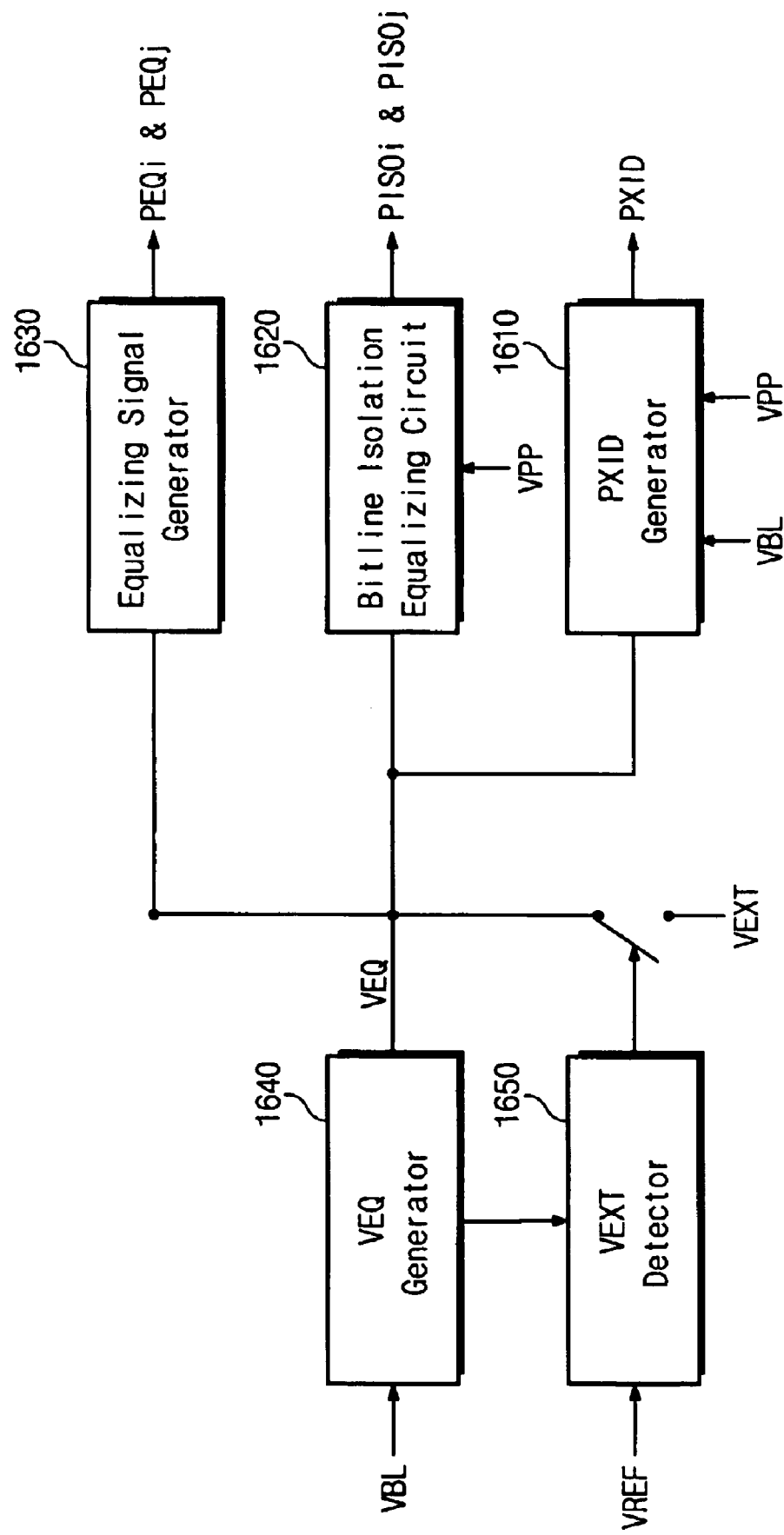
FIG. 16 illustrates another exemplary embodiment of the present invention, which may include a wordline driver signal generator.

FIG. 16 illustrates an example of the interconnection between, the exemplary embodiments of a bitline equalizing voltage generator 1640, a bitline equalizing signal generator 1630, a bitline isolation signal equalizing circuit 1620, an external voltage detector 1650, a switching circuit 1660, and a wordline driver signal circuit 1610. The bitline equalizing voltage generator 1640 may operate in the same, or substantially the same, manner as the bitline equalizing voltage generator 900 (of FIG. 9). The bitline equalizing signal generator 1630 may operate in the same, or substantially the same, manner as the bitline equalizing signal generator 501 and/or 502 (of FIGS. 5A and/or 5B). The bitline isolation signal equalizing circuit 1620 may operate in the same, or substantially the same, manner as the bitline isolation equalizing circuit 400 (of FIG. 4). The external voltage detector 1650 may operate in the same, or substantially the same, manner as the external voltage detector 910 (of FIG. 9). The switching circuit 1660 may operate in the same, or substantially the same, manner as the switching circuit 950 (of FIG. 9). The wordline driver signal circuit 1610 may operate in the same, or substantially the same, manner as the wordline driver signal circuit 600 (of FIG. 6).

The exemplary embodiment as illustrated in FIG. 16 may be similar, or substantially similar, to the exemplary embodiment of the present invention as illustrated in FIG. 15, however, the boost voltage VPP in the wordline drive signal PXID may be reused (recycled), for example, to charge the bitline equalizing signal PEQi to the bitline equalizing voltage VEQ.

Figure 17:
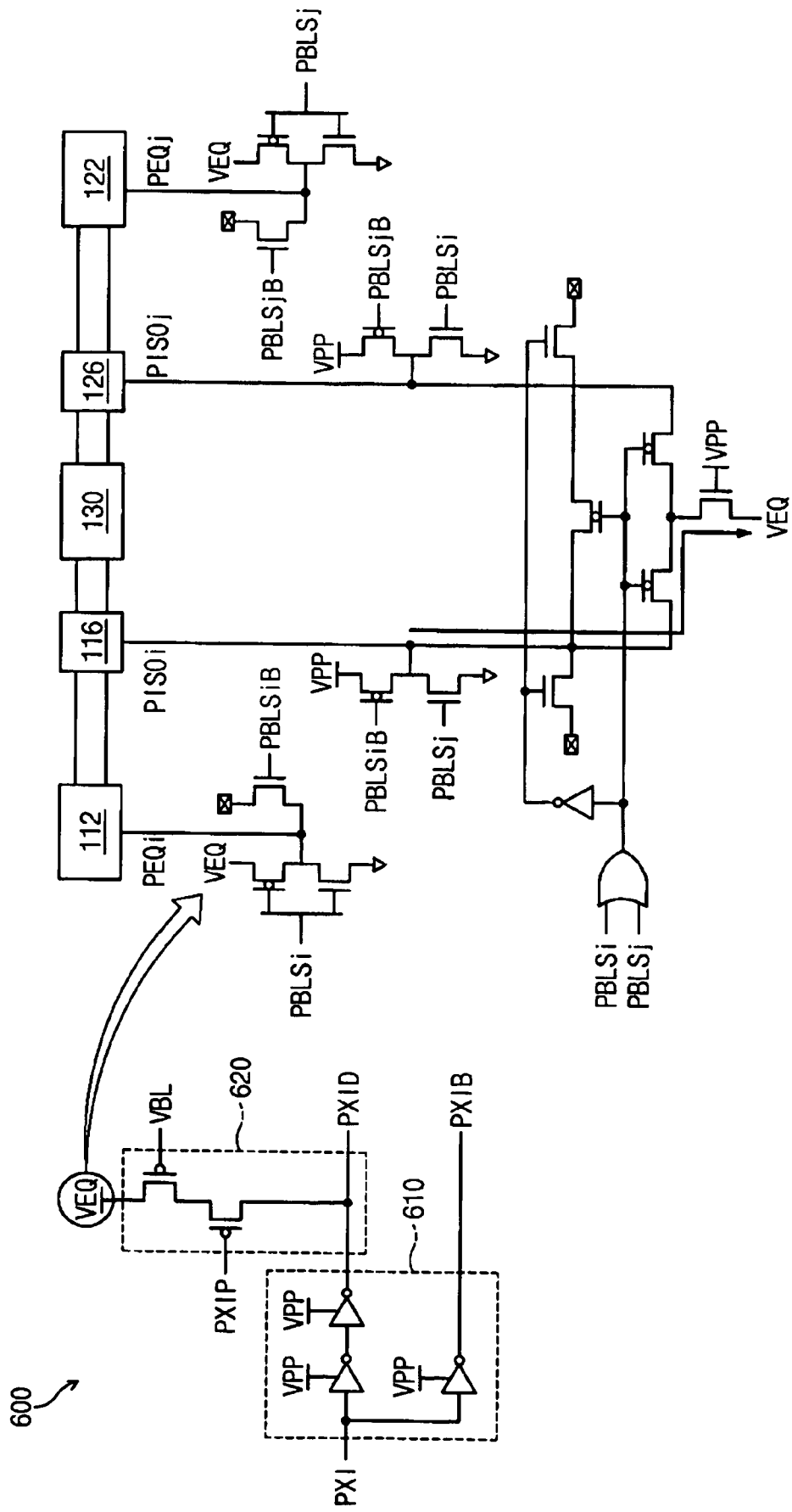
FIG. 17 illustrates an example connection of exemplary embodiments of bitline equalizing signal generators of FIGS. 5A and 5B and an exemplary embodiment of the wordline driver signal circuit of FIG. 6.

FIG. 17 illustrates an example of the connection between the exemplary embodiments of the memory device of FIG. 1, the bitline isolation signal generators of FIGS. 3A and 3B, the bitline isolation signal equalizing circuit of FIG. 4, the bitline equalizing signal generators of FIGS. 5A and 5B, and the wordline driver signal circuit of FIG. 6.

As illustrated in FIG. 17, the wordline drive signal PXID may be in an active state and may have a boost voltage of VPP. The wordline drive signal PXID may be a lower pulse signal, for example, when the boost voltage VPP of the wordline drive signal PXID may be used to charge the PEQi signal to the bitline equalizing voltage VEQ.

While exemplary embodiments of the present invention has been particularly shown and described with reference to the exemplary embodiments described above, it will be understood by those skilled in the art that these embodiments do not limit the present invention, and that various changes in form and details may be made without departing from the spirit or scope of the invention as defined by the appended claims.

What is claimed is:

1. A semiconductor memory device that selectively connects a block of memory cells to a sense amplifier via a pair of bitlines based on a bitline isolation signal, the device comprising:
    a bitline equalizing circuit for applying a bitline precharge voltage to the pair of bitlines in response to a bitline equalizing signal; and
    a bitline isolation signal equalizing circuit configured to generate a bitline equalizing voltage by utilizing a voltage of at least one of the bitline isolation signal and a wordline drive signal, the generated bitline equalizing voltage being sufficient to turn on a transistor within the bitline equalizing circuit.

2. The semiconductor memory device according to claim 1, wherein the bitline isolation signal equalizing circuit further comprises:
    a controller for generating a control signal in response to a block selection signal; and
    a transfer circuit configured to transfer at least a portion of the voltage of the bitline isolation signal as the bitline equalizing voltage when the control signal indicates that the bitline isolation signal is deactivated.

3. The semiconductor memory device according to claim 1, wherein
    an external voltage is applied to the semiconductor memory device, and the semiconductor memory device further includes,
    a bitline equalizing signal generator configured to selectively output at least one of the bitline equalizing voltage and the external voltage as the bitline equalizing signal in response to a block selection signal, the output bitline equalizing signal being used to activate a bitline equalizing circuit to apply a bitline precharge voltage to the pair of bitlines.

4. The semiconductor memory device according to claim 3, wherein the bitline equalizing signal generator further comprises:
    a first driver configured to apply the bitline equalizing voltage to an output terminal for the bitline equalizing signal when the block selection signal is activated; and
    a second driver configured to apply the external voltage to the output terminal for the bitline equalizing signal when the block selection signal is activated.

5. The semiconductor memory device according to claim 1, wherein
    the semiconductor memory device includes first and second blocks of memory cells, the first block being selectively connected to the sense amplifier based on a first isolation signal and the second block being selectively connected to the sense amplifier based on a second bitline isolation signal, and
    the bitline isolation signal equalizing circuit includes an equalizer configured to receive voltages of the first and second isolation signals and to produce a voltage between the received voltages when one of the first and second isolation signals is deactivated, and a transfer circuit for transferring the produced voltage as the bitline equalizing voltage.

6. The semiconductor memory device according to claim 1, wherein the bitline equalizing voltage generator comprising:
    a wordline drive signal generator configured to generate the wordline drive signal having a boost voltage level in response to a row address signal provided by a row decoder; and
    a bitline equalizing voltage driver configured to output the word line drive signal as the bitline equalizing voltage when a wordline drive pulse signal indicates a transition of the row address signal.

7. The semiconductor memory device according to claim 6, wherein the bitline equalizing voltage driver further comprises:
    a first PMOS transistor, a gate of the first PMOS transistor being supplied the wordline drive pulse signal, a source of the first PMOS transistor being supplied the word line drive signal; and
    a second PMOS transistor, a gate of the second PMOS transistor being supplied the bitline precharge voltage, a drain of the second PMOS transistor being an output terminal for the bitline equalizing voltage, a source thereof being connected to the drain of the first PMOS transistor.

8. The semiconductor memory device according to claim 1, further including,
a switching circuit, and
a bitline equalizing voltage generator, which generates a first bitline equalizing voltage, and further includes,
an external voltage detector configured to generate a first enable signal based on a comparison of an external voltage and a reference voltage,
a bitline equalizing voltage detector configured to generate a second enable signal based on a comparison of the bitline equalizing voltage and a bitline precharge voltage,
an oscillator configured to generate an oscillation signal based on the first and second enable signals, and
a charge pumping circuit configured to pump up the external voltage wherein
the switching circuit is configured to output at least one of the first bitline equalizing voltage and the external voltage as a second bitline equalizing voltage in response to the first enable signal.

9. The semiconductor memory device according to claim 8, wherein the external voltage detector includes,
a voltage divider including
first, second, and third resistors serially connected between a terminal applying the external voltage and a ground terminal, the second and third resistors being connected at a node, and
a parallel transistor including a drain and source respectively connected to either end of the first resistor;
a comparator configured to compare a reference voltage with a voltage at the node; and
a driver configured to generate the first enable signal based on an output of the comparator, wherein the generated first enable signal is fed back to a gate of the parallel transistor.

10. The semiconductor memory device according to claim 8, wherein the bitline equalizing voltage detector further includes,
a voltage down-converter including a diode-connected NMOS transistor and resistor serially connected between a terminal for the bitline equalizing voltage and a ground voltage, the diode-connected NMOS transistor and resistor being connected at a node;
a comparator configured to compare the bitline precharge voltage with a voltage at the node; and
a driver configured to generate the second enable signal based on an output of the comparator.

11. The semiconductor memory device according to claim 8, wherein the semiconductor memory device further includes,
a bitline equalizing signal generator configured to selectively output at least one of the second bitline equalizing voltage and the external voltage as the bitline equalizing signal in response to a block selection signal, the output bitline equalizing signal being used to activate a bitline equalizing circuit to apply a bitline precharge voltage to the pair of bitlines.

12. The semiconductor memory device according to claim 1, wherein,
the semiconductor memory device selectively connects a first and second block of memory cells to the sense amplifiers via a first and second pair of bitlines, respectively,
the first and second pair of bitlines are selectively connected to the sense amplifier in response to first and second bitline isolation signals, respectively,
the semiconductor memory device includes a first and second bitline equalizing circuit configured to apply the bitline precharge voltage to the first and second pair of bitlines, respectively, in response to first and second bitline equalizing signals, and
at least one of the first and second bitline equalizing signals is the bitline equalizing voltage generated by the bitline equalizing voltage generator.

13. A semiconductor memory device comprising:
a memory block including at least two bit lines;
an external voltage detector adapted to generate an enable signal based on an external voltage and a reference voltage;
an equalizing voltage generator adapted to generate an equalizing voltage in response to the enable signal;
a bit line equalizing signal generator adapted to generate a bitline equalizing signal in response to memory block information;
a bit line equalizing circuit adapted to equalize the at least two bit lines based on the bit line equalizing signal.

14. The memory device of claim 13, further including,
a switch, which connects the external voltage to the equalizing voltage based on the enable signal.

15. A semiconductor memory device comprising:
a first voltage generator for supplying a first voltage to a first signal line;
a second voltage generator for supplying a second voltage to a second signal line; and
a switch for supplying a charge of the second voltage to the first signal in response to a transition of the second signal from the second voltage to the first voltage.

16. A semiconductor memory device operating in a precharge or an active state, the device comprising:
an external voltage detector adapted to output an enable signal based on a comparison of an external voltage and a reference voltage;
a bitline equalizing voltage generator adapted to generate a bitline equalizing voltage based on the enable signal;
a bitline equalizing signal generator adapted to generate at least one bitline equalizing signal; and
a bitline isolation signal equalizing circuit adapted to generate at least one bitline isolation signal; wherein
the at least one bitline equalizing signal has voltage level equal to the bitline equalizing voltage level or a ground voltage level and the at least one bitline isolation signal has a voltage level equal to a boost voltage level or a ground voltage level based on the state of the memory device.

17. The semiconductor memory device of claim 16, further including
a wordline driver signal circuit adapted to provide the equalizing voltage to the bitline equalizing signal generators.

18. A semiconductor memory device comprising:
at least two memory blocks, each memory block having a bitline pair;
a plurality of bitline equalizing circuits for providing a bitline pre-charge to each bitline pair in response to a bitline equalizing signal;
a plurality of bitline equalizing signal generators for providing the bitline equalizing signal to each of the bitline equalizing circuits in response to memory block information;

a sense amplifier provided between each pair of bitlines;

a plurality of bitline isolation circuits for selectively connecting one of the memory blocks to a sense amplifier in response to respective bitline isolation signals generated by a plurality of bitline isolation signal generators;

an isolation signal equalizing circuit for equalizing the bitline isolation signals to the equalizing voltage in response to memory block information; wherein when the isolation signals are equalized, the bit line equalizing signal has a boosted voltage.

19. The semiconductor device of claim 17, further including, a wordline driver signal circuit adapted to provide the equalizing voltage to the bitline equalizing signal generators, and wherein the wordline driver signal circuit includes, a wordline drive signal generator configured to generate the wordline drive signal in response to memory block information, and a bitline equalizing voltage driver configured to output the word line drive signal as the bitline equalizing voltage when a wordline drive pulse signal indicates a transition of the row address signal.

* * * * *